US012701886B2

(12) United States Patent
Lee et al.

(10) Patent No.: US 12,701,886 B2
(45) Date of Patent: Aug. 4, 2026

(54) DISPLAY DEVICE

(71) Applicant: Samsung Display Co., LTD., Yongin-si (KR)

(72) Inventors: Hyeon Bum Lee, Yongin-si (KR); Hyun Ho Kim, Yongin-si (KR); Hyoeng Ki Kim, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 437 days.

(21) Appl. No.: 18/519,219

(22) Filed: Nov. 27, 2023

(65) Prior Publication Data

US 2024/0349565 A1     Oct. 17, 2024

(30) Foreign Application Priority Data

Apr. 13, 2023     (KR) ........................ 10-2023-0048659

(51) Int. Cl.
| | |
|---|---|
| *H10K 59/35* | (2023.01) |
| *H10K 59/122* | (2023.01) |
| *H10K 59/126* | (2023.01) |
| *H10K 59/38* | (2023.01) |
| *H10K 59/40* | (2023.01) |
| *H10K 59/65* | (2023.01) |

(52) U.S. Cl.
CPC ......... *H10K 59/353* (2023.02); *H10K 59/122* (2023.02); *H10K 59/126* (2023.02); *H10K 59/38* (2023.02); *H10K 59/40* (2023.02); *H10K 59/65* (2023.02)

(58) Field of Classification Search
None
See application file for complete search history.

(56) References Cited

U.S. PATENT DOCUMENTS

2018/0006272 A1*     1/2018     Lee ...................... H10K 59/875

* cited by examiner

Primary Examiner — Anthony Ho
(74) *Attorney, Agent, or Firm* — Harness, Dickey & Pierce, P.L.C.

(57) ABSTRACT

A display device includes a substrate including a first display area and a second display area, a passivation layer overlapping the first display area and the second display area, an insulating layer overlapping the second display area and on the passivation layer, a first light emitting element on the passivation layer and in the first emission area; and a second light emitting element on the passivation layer and in the second emission area. The insulating layer includes a first surface facing the passivation layer, a second surface opposite to the first surface, and an inclined surface connecting the first surface and the second surface, the first light emitting element includes a first pixel electrode on the passivation layer, and the second light emitting element includes a second pixel electrode including a first portion on the passivation layer and a second portion on the inclined surface of the insulating layer.

20 Claims, 16 Drawing Sheets

100

CFL
TSL
TFEL
EML
TFTL

SUB

Z

X1

X1'

PA1(PA): RE1, GE11, GE12, BE1

PA1(PA): RE1, GE11, GE12, BE1
PA2(PA): RE2, GE21, GE22, BE2

TSL: TE, TIL
EML: ED2, PDL2
LD2: LD2a, LD2b, LD2c

TSL: TE, TIL
EML: ED1, PDL0

TSL: TE, TIL
EML: ED4, PDL3
LD4: LD4a, LD4b, LD4c

DISPLAY DEVICE

CROSS REFERENCE TO RELATED APPLICATION(S)

This application claims priority to and benefits of Korean Patent Application No. 10-2023-0048659 under 35 U.S.C. § 119, filed on Apr. 13, 2023, the entire content of which are incorporated herein by reference.

BACKGROUND

1. Technical Field

Embodiments relate to a display device.

2. Description of the Related Art

As the information society develops, demands for display devices displaying images are increasing in various fields. For example, display devices are applied to various electronic devices such as smartphones, digital cameras, notebook computers, navigation devices, and smart televisions.

A mobile electronic device includes a display device for displaying an image to a user. The usage of mobile electronic devices, which have a larger display screen with the same or smaller volume and thickness, has been increased. Further, a foldable display device or a bendable display device, which is folded and unfolded to provide a larger display screen, is also being developed.

Furthermore, as display devices are applied to various electronic devices, display devices having various designs are required. For example, in the case of a smartphone, an optical device disposed on the front of a display device may be required to be disposed under a display panel. Thus, a display area of the display panel may be increased.

SUMMARY

Embodiments provide a display device including a display panel capable of preventing or minimizing defects in which the overall intensity of white display light is weakened, and white light includes blue light when there occurs a difference in side visibility between a first display area and a second display area in the display panel including the first display area and the second display area.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include a substrate including a first display area including a first emission area and a first light blocking area around the first emission area and a second display area including a second emission area, a second light blocking area around the second emission area, and a transmissive area, a passivation layer overlapping the first display area and the second display area and disposed on the substrate, an insulating layer overlapping the second display area and disposed on the passivation layer, a first light emitting element disposed on the passivation layer and in the first emission area; and a second light emitting element disposed on the passivation layer and in the second emission area, wherein the insulating layer may include a first surface facing the passivation layer, a second surface opposite to the first surface and an inclined surface connecting the first surface and the second surface, the first light emitting element may include a first pixel electrode disposed on the passivation layer, and the second light emitting element may include a second pixel electrode including a first portion disposed on the passivation layer and a second portion disposed on the inclined surface of the insulating layer.

In an embodiment, a display device may include a first pixel defining layer disposed on the passivation layer and the first pixel electrode in the first display area and defining a first opening which exposes at least a portion of the first pixel electrode; a second pixel defining layer disposed on the insulating layer and the second pixel electrode in the second display area and defining a second opening which exposes at least a portion of the second pixel electrode; and a light blocking pattern layer overlapping the first pixel defining layer in the first light blocking area and overlapping the second pixel defining layer in the second light blocking area.

In an embodiment, the first opening may include a plurality of first openings, and a width of the first pixel defining layer disposed between two neighboring first openings among the plurality of first openings may be greater than a width of the light blocking pattern layer disposed between the two neighboring first openings and overlapping the first pixel defining layer.

In an embodiment, the second opening may include a plurality of second openings, and a width of the second pixel defining layer disposed between two neighboring second openings among the plurality of second openings may be substantially equal to a width of the light blocking pattern layer disposed between the two neighboring second openings and overlapping the second pixel defining layer.

In an embodiment, the first pixel defining layer and the second pixel defining layer may include a light blocking material.

In an embodiment, the inclined surface of the insulating layer may overlap the second emission area.

In an embodiment, a first inclination angle formed by the inclined surface and the first surface of the insulating layer may be an acute angle.

In an embodiment, the insulating layer may be disposed between the second pixel defining layer and the passivation layer and may not be disposed between the first pixel defining layer and the passivation layer.

In an embodiment, the first display area may include a first gap between an end portion of the first pixel defining layer in a first direction and an end portion of the light blocking pattern layer in the first direction, and the second display area may include a second gap between an end portion of the insulating layer in the first direction and an end portion of the light blocking pattern layer in the first direction, wherein the first gap may be greater than the second gap.

In an embodiment, the first gap may be about 5 $\mu$m to about 6 $\mu$m, and the second gap may be about 5 $\mu$m or less.

In an embodiment, a display device may include an optical device disposed in the second display area to overlap the transmissive area.

In an embodiment, a light transmittance of the second display area may be higher than a light transmittance of the first display area.

In an embodiment, a display device may include a thin-film encapsulation layer disposed on the first light emitting element and the second light emitting element; a color filter layer disposed on the thin-film encapsulation layer; and an overcoat layer and a touch electrode layer disposed between the thin-film encapsulation layer and the color filter layer, wherein the thin-film encapsulation layer may include a first inorganic layer, a second inorganic layer and an organic layer disposed between the first inorganic layer and the second inorganic layer, a dielectric constant of the overcoat layer may be lower than a dielectric constant of the second inorganic layer of the thin-film encapsulation layer, the touch electrode layer may include a touch electrode, and the touch electrode overlaps a light blocking pattern layer.

In an embodiment, a display device may include a substrate including a first display area including a first emission area and a first light blocking area around the first emission area and a second display area including a second emission area, a second light blocking area around the second emission area, and a transmissive area; a passivation layer overlapping the first display area and the second display area and disposed on the substrate; a first insulating layer overlapping the first display area and disposed on the passivation layer; a second insulating layer overlapping the second display area and disposed on the passivation layer; a first light emitting element disposed on the passivation layer and in the first emission area; and a second light emitting element disposed on the passivation layer and in the second emission area, wherein the first insulating layer may include a first surface facing the passivation layer, a second surface opposite to the first surface, a first inclined surface connecting the first surface and the second surface and a first inclination angle may be formed by the first surface and the first inclined surface, and the second insulating layer may include a third surface facing the passivation layer, a fourth surface opposite to the third surface, a second inclined surface connecting the third surface and the fourth surface and a second inclination angle may be formed by the third surface and the second inclined surface, wherein the first inclination angle and the second inclination angle may be acute angles, and the second inclination angle may be greater than the first inclination angle.

In an embodiment, the second inclination angle may be greater than the first inclination angle by about 15 degrees or more.

In an embodiment, the first light emitting element may include a first pixel electrode, and the second light emitting element may include a second pixel electrode, wherein the first pixel electrode may include a first portion facing the passivation layer and a second portion spaced apart from the passivation layer with the first insulating layer interposed between the passivation layer and the second portion and contacting the first inclined surface of the first insulating layer, and the second pixel electrode may include a third portion facing the passivation layer and a fourth portion spaced apart from the passivation layer with the second insulating layer interposed between the passivation layer and the fourth portion and contacting the second inclined surface of the second insulating layer.

In an embodiment, a display device may include a first pixel defining layer disposed on the first insulating layer and the first pixel electrode in the first display area and defining a first opening which exposes at least a portion of the first pixel electrode; a second pixel defining layer disposed on the second insulating layer and the second pixel electrode in the second display area and defining a second opening which exposes at least a portion of the second pixel electrode; and a light blocking pattern layer overlapping the first pixel defining layer and the second pixel defining layer in the first light blocking area and the second light blocking area.

In an embodiment, end portions of each of the first pixel defining layer and the second pixel defining layer in a first direction may be aligned with end portions of the light blocking pattern layer.

In an embodiment, the first display area may include a first gap in a first direction between an end portion of the first insulating layer and an end portion of the light blocking pattern layer, and the second display area may include a second gap in the first direction between an end portion of the second insulating layer and an end portion of the light blocking pattern layer, wherein the first gap overlaps the first inclined surface of the first insulating layer, and the second gap overlaps the second inclined surface of the second insulating layer.

In an embodiment, the second gap may be smaller than or equal to the first gap.

According to examples of display devices, the brightness difference according to the viewing angle of the first display area and the second display area in a display panel including the first display area and the second display area can be improved.

According to examples of display devices, users can sufficiently recognize light emitted from the outside of the display device even from the side.

The effects according to the examples are not limited to the contents described above and various effects are included in the specification.

BRIEF DESCRIPTION OF THE DRAWINGS

These and/or other features of embodiments of the invention will become apparent and more readily appreciated from the following description of the embodiments, taken in conjunction with the accompanying drawings, in which.

DETAILED DESCRIPTION OF THE EMBODIMENTS

Figure 1:
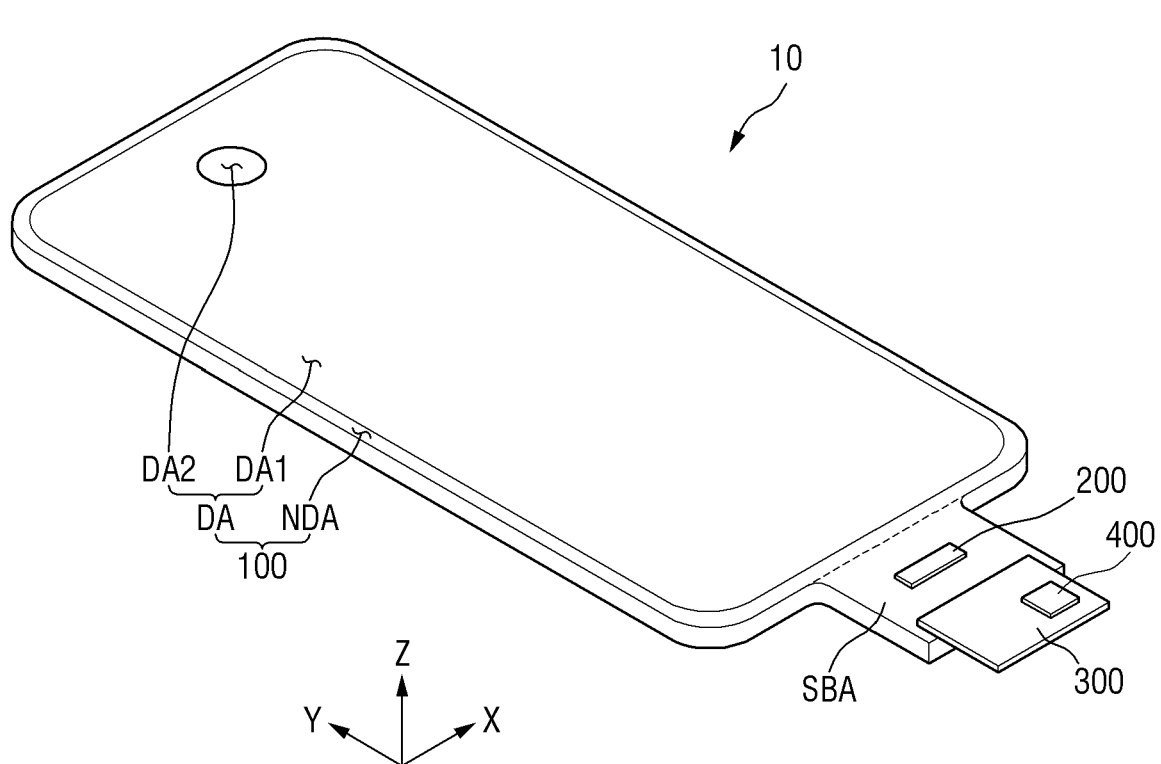
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

Figure 2:
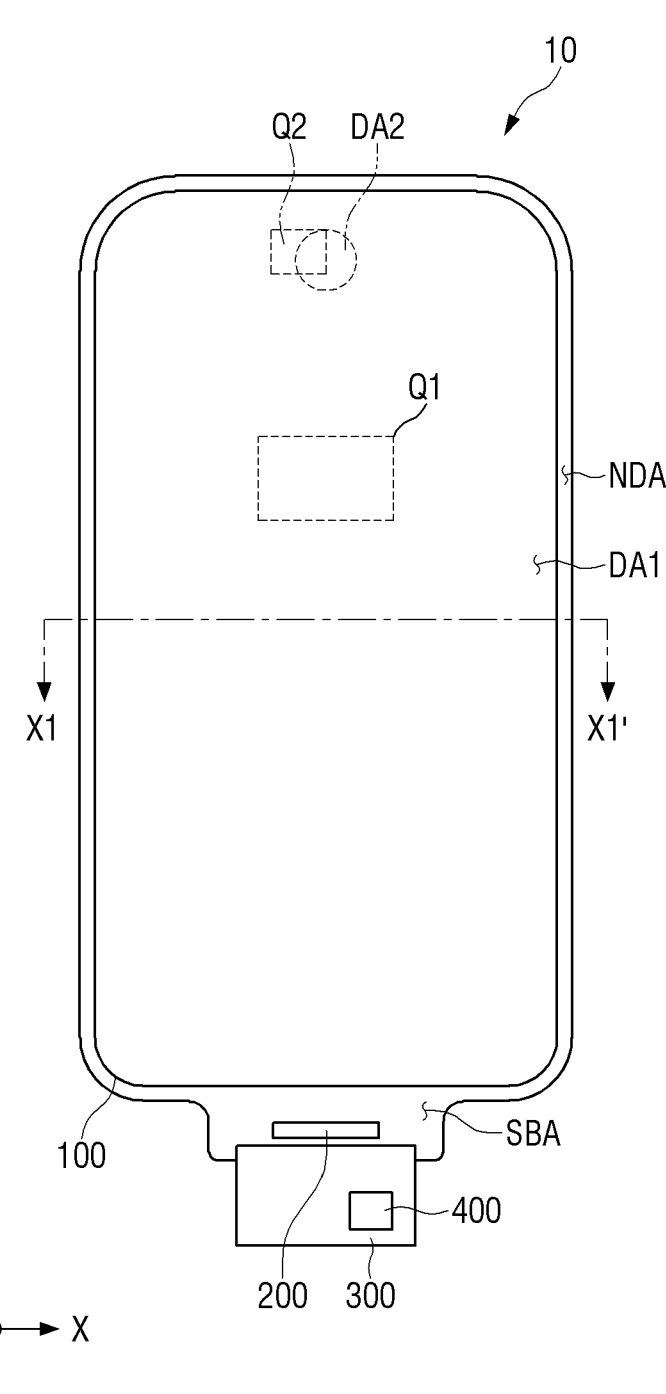
FIG. 2 is a schematic plan view of the display device according to the embodiment.

FIG. 1 is a schematic perspective view of a display device 10 according to an embodiment. FIG. 2 is a schematic plan view of the display device 10 according to the embodiment.

Referring to FIGS. 1 and 2, the display device 10 may be a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards, and Internet of Things (IoT) devices.

The display device 10 may be a light emitting display device such as an organic light emitting display device with an organic light emitting diode, a quantum dot light emitting display device including a quantum dot light emitting layer, an inorganic light emitting display device including an inorganic semiconductor, a micro-light emitting display device with a micro-light emitting diode, or a nano-light emitting display device with a nano-light emitting diode. A case where the display device 10 is an organic light emitting display device will be described below, but embodiments are not limited thereto.

The display device 10 may include a display panel 100 and a sub-area SBA, and the sub-area SBA may include a display driving circuit 200, a circuit board 300 and a touch driving circuit 400.

The display panel 100 may be shaped like a rectangular plane having short sides in a first direction X and long sides in a second direction Y intersecting the first direction X. Each corner where a short side extending in the first direction X meets a long side extending in the second direction Y may be rounded at a certain curvature or may be right-angled. The planar shape of the display panel 100 is not limited to a quadrilateral shape but may also be another polygonal shape, a circular shape, or an oval shape. The display panel 100 may be formed flat, but embodiments are not limited thereto. For example, the display panel 100 may include curved portions formed at left and right end portions and having a constant or varying curvature. For example, the display panel 100 may be formed to be flexible so that the display panel 100 may be curvable, foldable, or rollable.

The display panel 100 may include a display area DA and a non-display area NDA positioned around the display area DA. The display area DA may include a first display area DA1 having an image display function and a second display area DA2 having both a camera function and an image display function.

The first display area DA1 may not include a transmissive area TA that transmits light and may include only pixel areas PX, in which pixels for displaying an image are arranged. For example, the second display area DA2 may include both a transmissive area TA that transmits light and pixel areas PX, in which pixels for displaying an image are arranged. Therefore, light transmittance of the second display area DA2 may be higher than that of the first display area DA1.

The second display area DA2 may include a technology of inserting an optical device (e.g., a front camera) under the display panel 100. The second display area DA2 may be disposed on a side of the first display area DA1, for example, on an upper side of the first display area DA1 as illustrated in FIGS. 1 and 2, but embodiments are not limited thereto.

The non-display area NDA may neighbor (or be adjacent to) the display area DA. The non-display area NDA may be an area outside the display area DA and may surround the display area DA. The non-display area NDA may be an edge area of the display panel 100.

The sub-area SBA may protrude from a side of the display panel 100 in the second direction Y. Although the sub-area SBA is unfolded in FIGS. 1 and 2, it may also be bent. For example, the sub-area SBA may be disposed on a lower surface of the display panel 100. In case that the sub-area SBA is bent, the sub-area SBA may overlap the display panel 100 in a third direction Z (e.g., thickness direction) of the display device 10.

As illustrated in FIGS. 1 and 2, the sub-area SBA may include the display driving circuit 200, the circuit board 300, and the touch driving circuit 400.

The display driving circuit 200 may generate signals and voltages for driving the display panel 100. The display driving circuit 200 may be formed as an integrated circuit and attached onto the display panel 100 by using a chip-on-glass (COG) method, a chip-on-plastic (COP) method, or an ultrasonic bonding method. However, embodiments are not limited thereto. For example, the display driving circuit 200 may also be attached onto the circuit board 300 by using a chip-on-film (COF) method.

The circuit board 300 may be attached to an end portion of the sub-area SBA of the display panel 100. Accordingly, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

The touch driving circuit 400 may be connected to touch electrodes of a touch electrode layer TSL of the display panel 100. The touch driving circuit 400 may transmit driving signals to the touch electrodes of the touch electrode layer TSL and may measure capacitance values of the touch electrodes. The driving signals may be signals having driving pulses. The touch driving circuit 400 may determine whether a touch has been input based on the capacitance values and may calculate touch coordinates at which a touch has been input.

The touch driving circuit 400 may be disposed on the circuit board 300. The touch driving circuit 400 may be formed as an integrated circuit and attached to the circuit board 300.

Figure 3:
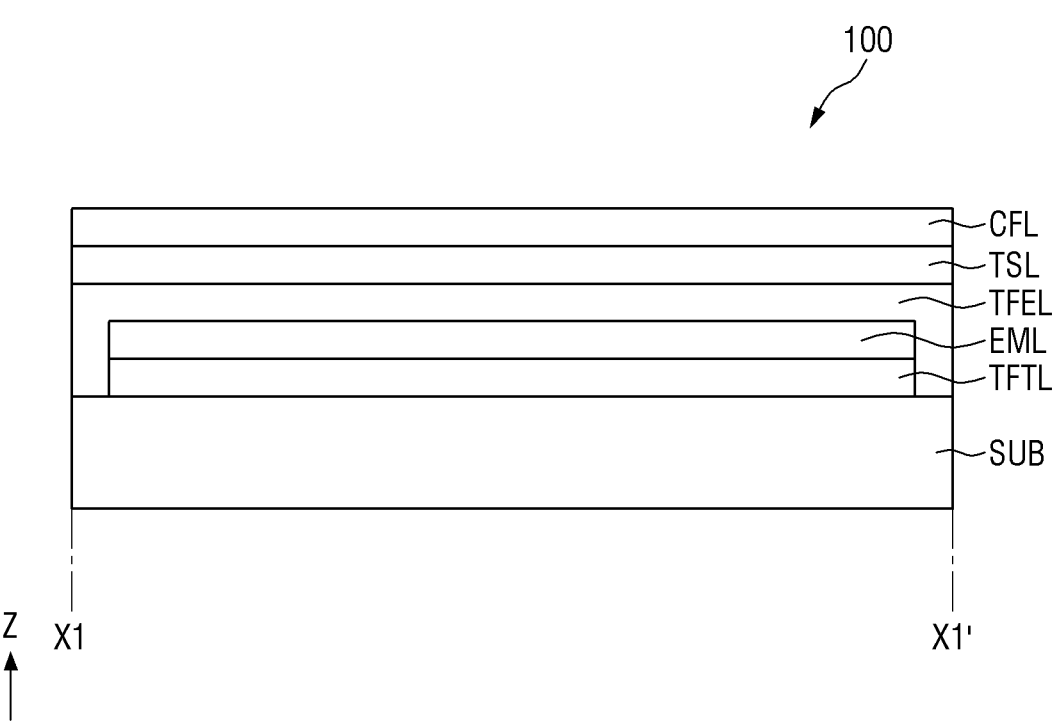
FIG. 3 is a schematic cross-sectional view of an embodiment of the display device, taken along line X1-X1' of FIG. 2.

FIG. 3 is a schematic cross-sectional view of an embodiment of the display device 10, taken along line X1-X1' of FIG. 2.

As illustrated in FIG. 3, the display panel 100 may include a substrate SUB, a thin-film transistor layer TFTL disposed on the substrate SUB, a light emitting element layer EML, a thin-film encapsulation layer TFEL, the touch electrode layer TSL, and a color filter layer CFL.

The substrate SUB may be made of an insulating material such as polymer resin. For example, the substrate SUB may be made of polyimide. The substrate SUB may be a flexible substrate that is bendable, foldable, or rollable.

The thin-film transistor layer TFTL may be disposed on the substrate SUB. The thin-film transistor layer TFTL may be disposed in the display panel 100 and the sub-area SBA and may include thin-film transistors.

The light emitting element layer EML may be disposed on the thin-film transistor layer TFTL. The light emitting element layer EML may be disposed in the display area DA. The light emitting element layer EML may include emission areas PA and a pixel defining layer PDL disposed in the pixel areas PX.

The thin-film encapsulation layer TFEL may be disposed on the light emitting element layer EML. The thin-film encapsulation layer TFEL may be disposed in the display area DA and the non-display area NDA. The thin-film encapsulation layer TFEL may include at least one inorganic layer and at least one organic layer to encapsulate the light emitting element layer EML.

The touch electrode layer TSL may be disposed on the thin-film encapsulation layer TFEL. The touch electrode layer TSL may be disposed in the display area DA and the non-display area NDA. The touch electrode layer TSL may sense a touch of a person or an object by using touch electrodes TE.

The color filter layer CFL may be disposed on the touch electrode layer TSL.

For example, the color filter layer CFL may include a light blocking pattern layer BM overlapping color filters CF.

Figure 4:
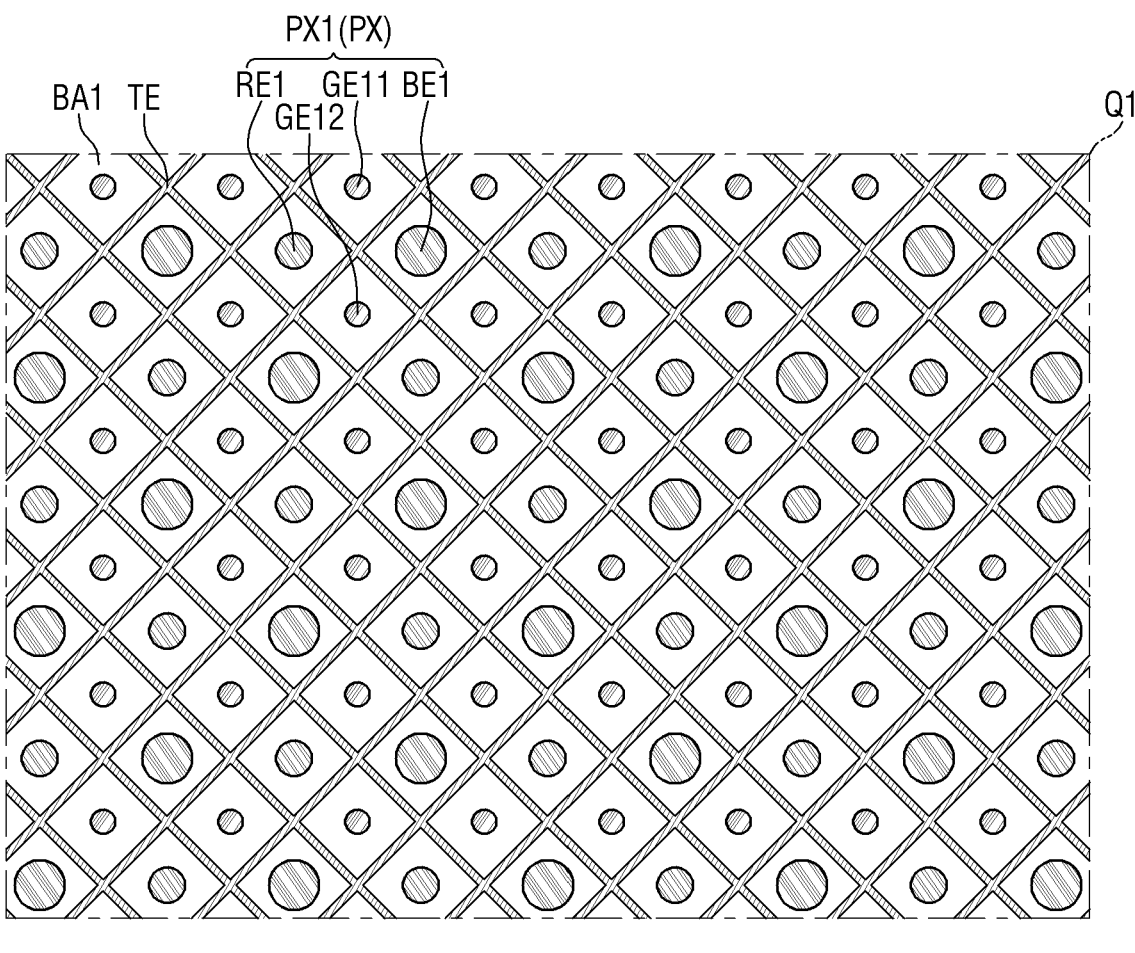
FIG. 4 is an enlarged schematic plan view of a portion Q1 in a first display area of a display panel according to the embodiment of FIG. 2.
Figure 4:
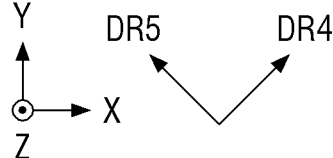

FIG. 4 is an enlarged schematic plan view of a portion Q1 in the first display area DA1 of the display panel 100 according to the embodiment of FIG. 2.

As illustrated in FIG. 4, the first display area DA1 may include first pixel areas PX1, and each of the first pixel areas PX1 may include first emission areas PA1, a first light blocking area BA1, and a touch electrode TE.

In some embodiments, each of the first emission areas PA1 may be a first light emitting unit RE1 emitting light of a first color, a second light emitting unit GE11 or a fourth light emitting unit GE12 emitting light of a second color, or a third light emitting unit BE1 emitting light of a third color.

For example, each of the first emission areas PA1 may be one of the first light emitting unit RE1, the second light emitting unit GE11, the third light emitting unit BE1, and the fourth light emitting unit GE12.

In some embodiments, each of the first pixel areas PX1 may include all of the first light emitting unit RE1 emitting light of the first color, the second light emitting unit GE11 and the fourth light emitting unit GE12 emitting light of the second color, and the third light emitting unit BE1 emitting light of the third color. For example, the first color may be red, the second color may be green, and the third color may be blue.

For example, each of the first pixel areas PX1 may include all of the first light emitting unit RE1, the second light emitting unit GE11, the third light emitting unit BE1, and the fourth light emitting unit GE12.

As illustrated in FIG. 4, the first light emitting unit RE1 and the third light emitting unit BE1 included in each first pixel area PX1 may neighbor (or be adjacent to) each other along the first direction X, and the second light emitting unit GE11 and the fourth light emitting unit GE12 may neighbor (or be adjacent to) each other along the second direction Y.

In some embodiments, the first light emitting unit RE1 and the second light emitting unit GE11 may neighbor (or be adjacent to) each other in a fourth direction DR4, and the third light emitting unit BE1 and the fourth light emitting unit GE12 may neighbor (or be adjacent to) each other in the fourth direction DR4. For example, the first light emitting unit RE1 and the fourth light emitting unit GE12 may neighbor (or be adjacent to) each other in a fifth direction DR5, and the second light emitting unit GE11 and the third light emitting unit BE1 may neighbor (or be adjacent to) each other in the fifth direction DR5. However, embodiments are not limited thereto, and the arrangement of the first through fourth light emitting units RE1 through GE12 may be variously changed.

In some embodiments, each of the first light emitting unit RE1, the second light emitting unit GE11, the third light emitting unit BE1, and the fourth light emitting unit GE12 may have a circular shape in plan view. However, embodiments are not limited thereto. Each of the first light emitting unit RE1, the second light emitting unit GE11, the third light emitting unit BE1, and the fourth light emitting unit GE12 may also have a quadrilateral, polygonal, or oval planar shape other than a circular shape. For example, in FIG. 4, the area (or size) of the third light emitting unit BE1 may be the largest, and the areas (or sizes) of the second light emitting unit GE11 and the fourth light emitting unit GE12 may be the smallest, but embodiments are not limited thereto.

Referring to FIG. 4, the first light blocking area BA1 may be disposed around the first emission areas PA1. The first light blocking area BA1 may be an area, through which light does not pass, and may be an area, in which the light blocking pattern layer BM and a first pixel defining layer PDL1 overlap each other.

In some embodiments, the touch electrode TE may have a mesh structure or a net structure in plan view. The touch electrode TE may be disposed between the first emission areas PA1. The touch electrode TE may extend in the fourth direction DR4 and the fifth direction DR5. Since the touch electrode TE has a mesh structure or a net structure in plan view, the first emission areas PA1 may not overlap the touch electrode TE. Therefore, light emitted from the light emitting units RE1, GE11, GE12 and BE1 may be prevented from being blocked by the touch electrode TE such that luminance may not be reduced.

Figure 5:
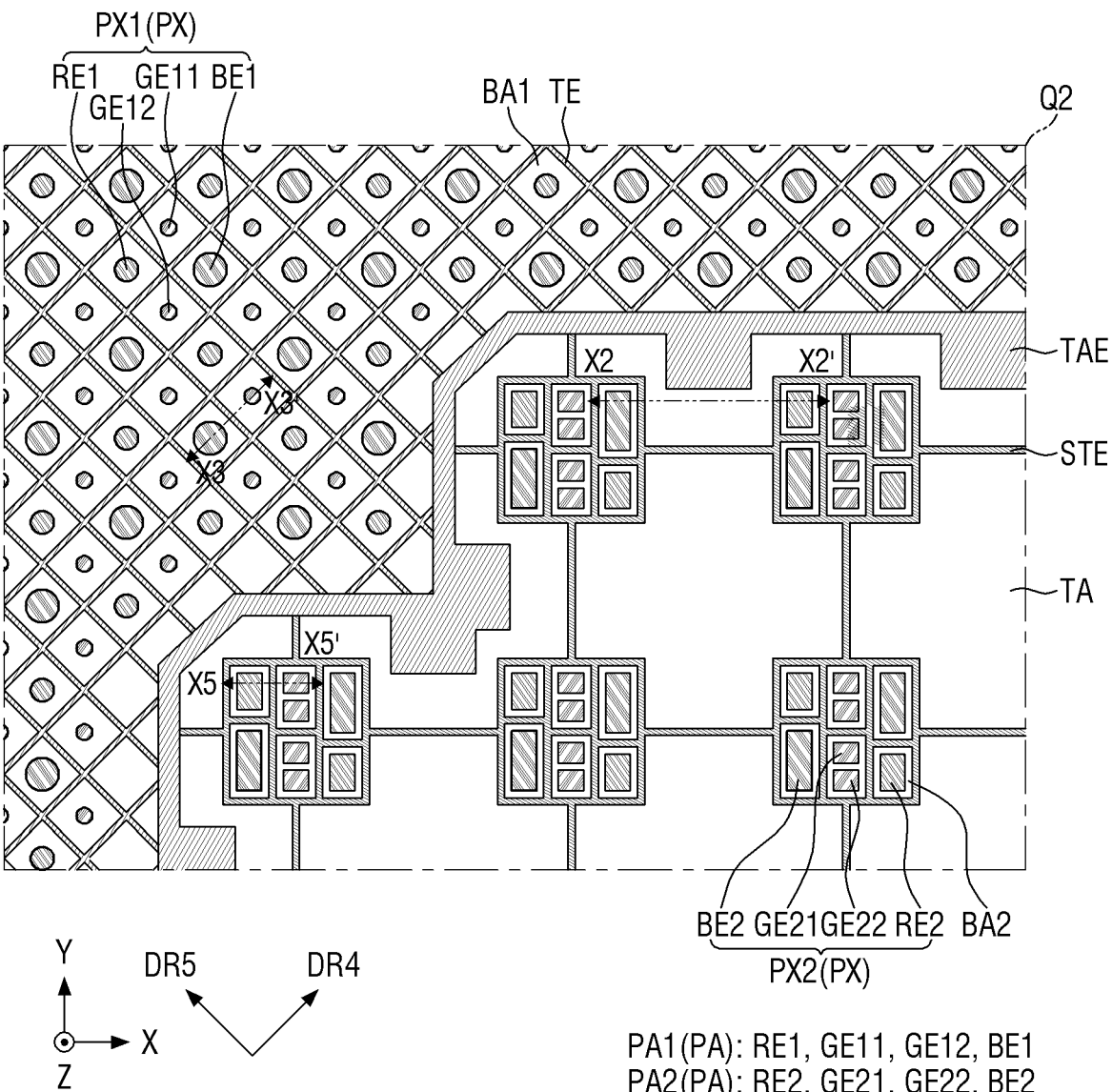
FIG. 5 is an enlarged schematic plan view of a portion Q2 in the first display area and a second display area of the display panel according to the embodiment of FIG. 2.

FIG. 5 is an enlarged schematic plan view of a portion Q2 in the first display area DA1 and the second display area DA2 of the display panel 100 according to the embodiment of FIG. 2.

As illustrated in FIG. 5, the second display area DA2 may include second pixel areas PX2, and each of the second pixel areas PX2 may include second emission areas PA2, a second light blocking area BA2, a transmissive area TA, a sub-touch electrode STE, and an auxiliary electrode TAE. The second display area DA2 may be different from the first display area DA1 in that the second display area DA2 includes the transmissive area TA including an optical device CM under the substrate SUB.

In some embodiments, each of the second emission areas PA2 may be a first light emitting unit RE2 emitting light of the first color, a second light emitting unit GE21 and a fourth light emitting unit GE22 emitting light of the second color, or a third light emitting unit BE2 emitting light of the third color.

For example, each of the second emission areas PA2 may be one of the first light emitting unit RE2, the second light emitting unit GE21, the third light emitting unit BE2, and the fourth light emitting unit GE22.

In some embodiments, each of the second pixel areas PX2 may include the first light emitting unit RE2 emitting light of the first color, the second light emitting unit GE21 and the fourth light emitting unit GE22 emitting light of the second color, and the third light emitting unit BE2 emitting light of the third color.

Although the second light emitting unit GE21 and the fourth light emitting unit GE22 included in each second pixel area PX2 emit light of the same color in FIG. 5, embodiments are not limited thereto. For example, the second light emitting unit GE21 and the fourth light emitting unit GE22 included in each second pixel area PX2 may also emit light of different colors.

For example, each of the second pixel areas PX2 may include all of the first light emitting unit RE2, the second light emitting unit GE21, the third light emitting unit BE2, and the fourth light emitting unit GE22.

In some embodiments, the first light emitting unit RE2 and the second light emitting unit GE21, the first light emitting unit RE2 and the fourth light emitting unit GE22, the third light emitting unit BE2 and the second light emitting unit GE21, and the third light emitting unit BE2 and the fourth light emitting unit GE22 may neighbor (or be adjacent to) each other in the first direction X. The second light emitting unit GE21 and the fourth light emitting unit GE22 may neighbor (or be adjacent to) each other in the second direction Y.

In some embodiments, the area (or size) of the third light emitting unit BE2 may be the largest, and the areas (or sizes) of the second light emitting unit GE21 and the fourth light emitting unit GE22 may be the smallest. The area (or size) of the second light emitting unit GE21 and the area (or size) of the fourth light emitting unit GE22 may be substantially the same as each other.

In some embodiments, the second pixel areas PX2 neighboring each other may be disposed adjacent to each other in the second direction Y. In one pair of second pixel areas PX2, the first light emitting unit RE2 of any one second pixel area PX2 may neighbor (or be adjacent to) the third light emitting unit BE2 of the other second pixel area PX2 in the second direction Y. In one pair of second pixel areas PX2, the second light emitting unit GE21 of any one second pixel area PX2 may neighbor (or be adjacent to) the second light emitting unit GE21 of the other second pixel area PX2 in the second direction Y.

The sub-touch electrode STE may surround at least one of the second emission areas PA2. For example, the sub-touch electrode STE may surround any one of the first light emitting unit RE2, the second light emitting unit GE21, the third light emitting unit BE2, and the fourth light emitting unit GE22. For example, the sub-touch electrode STE may surround each of the first light emitting unit RE2 and the third light emitting unit BE2 and may surround the second light emitting unit GE21 and the fourth light emitting unit GE22 as a whole.

The sub-touch electrode STE may be disposed between the first light emitting unit RE2 and the second light emitting unit GE21, between the first light emitting unit RE2 and the fourth light emitting unit GE22, between the second light emitting unit GE21 and the third light emitting unit BE2, and between the third light emitting unit BE2 and the fourth light emitting unit GE22. The sub-touch electrode STE may not be disposed between the second light emitting unit GE21 and the fourth light emitting unit GE22.

The sub-touch electrode STE may be disposed between the first light emitting unit RE2 of any one second pixel area PX2 and the third light emitting unit BE2 of the other second pixel area PX2 in one pair of second pixel areas PX2 neighboring each other. For example, the sub-touch electrode STE may be disposed between the third light emitting unit BE2 of any one second pixel area PX2 and the first light emitting unit RE2 of the other second pixel area PX2 in one pair of second pixel areas PX2. For example, the sub-touch electrode STE may be disposed between the fourth light emitting unit GE22 of any one second pixel area PX2 and the fourth light emitting unit GE22 of the other second pixel area PX2 in one pair of second pixel areas PX2.

The sub-touch electrode STE may surround edge portions of each pair of second pixel areas PX2. The sub-touch electrode STE surrounding the edge portions of any one pair of second pixel areas PX2 may be connected to the sub-touch electrode STE surrounding the edge portions of another pair of second pixel areas PX2 neighboring the any one pair of second pixel areas PX2 in the first direction X. The sub-touch electrode STE surrounding the edge portions of any one pair of second pixel areas PX2 may be connected to the sub-touch electrode STE surrounding the edge portions of another pair of second pixel areas PX2 neighboring the any one pair of second pixel areas PX2 in the second direction Y.

Figure 9:
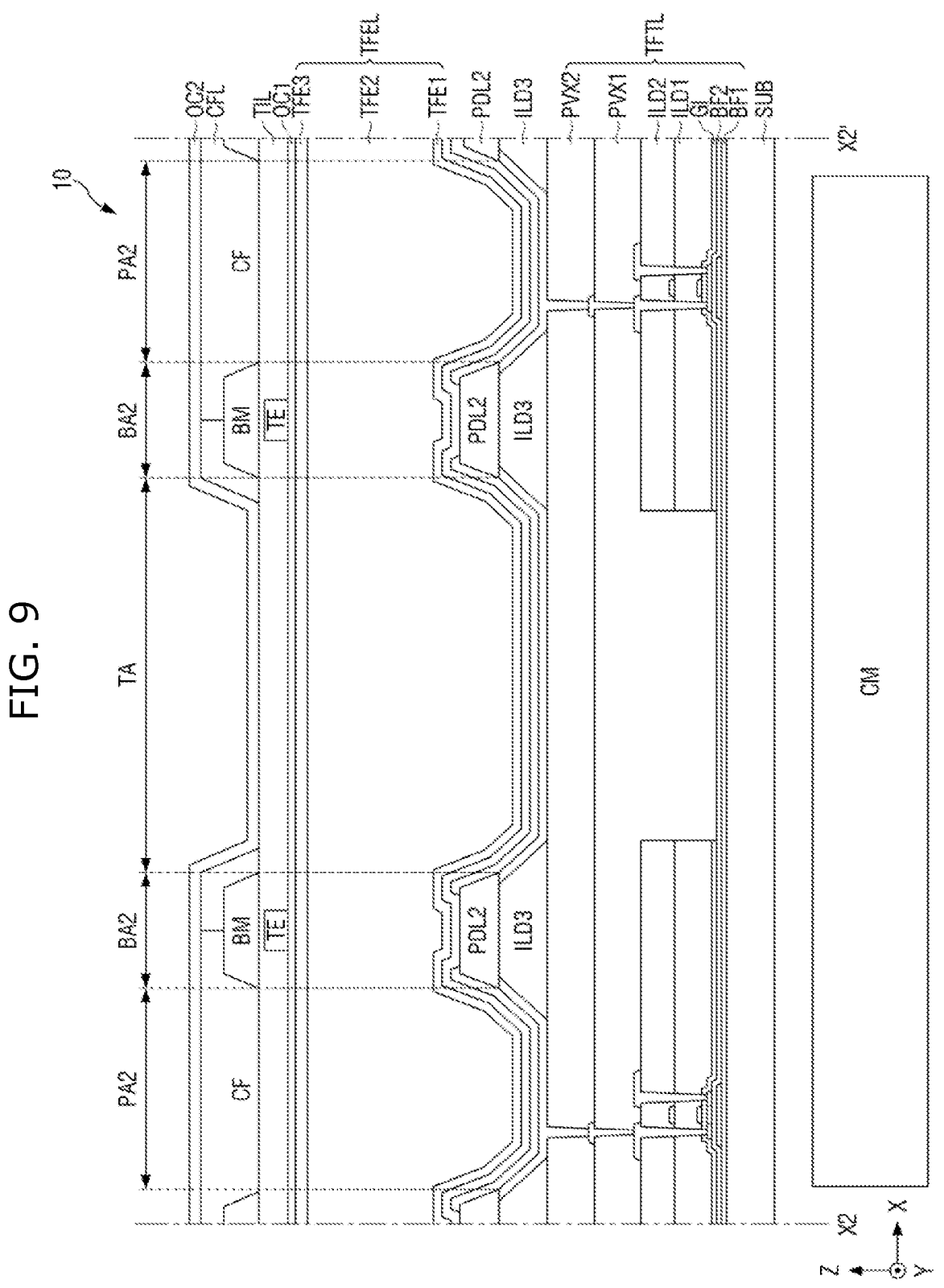
FIG. 9 is a schematic cross-sectional view of an embodiment of the display device, taken along line X2-X2' of FIG. 5.

The transmissive area TA may be defined by the sub-touch electrode STE. The transmissive area TA may include a structure through which light passes. As illustrated in FIG. 9, the transmissive area TA may include the substrate SUB, a first buffer layer BF1, a second buffer layer BF2, a first passivation layer PVX1, a second passivation layer PVX2, a first thin-film encapsulation layer TFE1, a second thin-film encapsulation layer TFE2, a third thin-film encapsulation layer TFE3, a first overcoat layer OC1, a touch insulating layer TIL, and a second overcoat layer OC2. Therefore, light incident on the transmissive area TA may pass through the transmissive area TA.

In some embodiments, the transmissive area TA may further include an optical device CM disposed under the substrate SUB and overlapping the transmissive area TA. For example, the optical device CM may be a camera.

In case that the area (or size) of the transmissive area TA is increased, light transmittance may be increased. However, since the number of second pixel areas PX2 is reduced, the resolution of the second display area DA2 may be reduced. For example, in case that the area (or size) of the transmissive area TA is reduced, the resolution may be increased, but the light transmittance may be reduced.

Referring to FIG. 5, the auxiliary electrode TAE may be disposed between the sub-touch electrode STE and the touch electrode TE. The auxiliary electrode TAE may be connected to the sub-touch electrode STE and the touch electrode TE. The sub-touch electrode STE and the auxiliary electrode TAE may be disposed on the touch insulating layer TIL.

The second light blocking area BA2 may be defined around the second emission areas PA2. The second light blocking area BA2 may be an area through which light does not pass and may be an area where the light blocking pattern layer BM and a second pixel defining layer PDL2 overlap each other.

Figure 6:
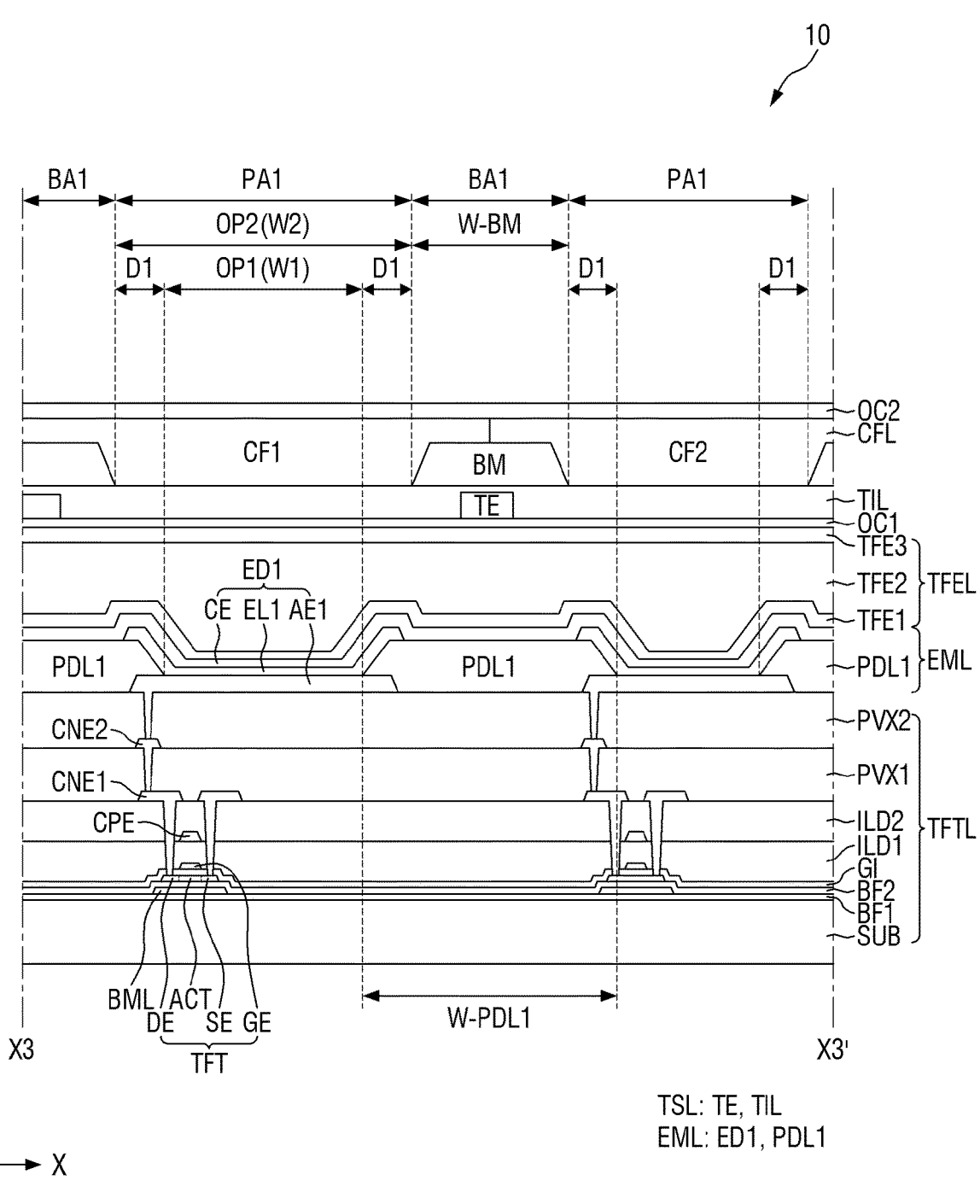
FIG. 6 is a schematic cross-sectional view of an embodiment of the display device, taken along line X3-X3' of FIG. 5.

FIG. 6 is a schematic cross-sectional view of an embodiment of the first display area DA1 of the display device 10, taken along line X3-X3' of FIG. 5.

A cross-sectional structure of the display device 10 will be described with reference to FIG. 6.

The substrate SUB has been mentioned above, and thus a detailed description thereof will be omitted for descriptive convenience.

The thin-film transistor layer TFTL may include the first buffer layer BF1, bottom metal layers BML, the second buffer layer BF2, thin-film transistors TFT, a gate insulating layer GI, a first interlayer insulating layer ILD1, capacitor electrodes CPE, a second interlayer insulating layer ILD2, first connection electrodes CNE1, the first passivation layer PVX1, second connection electrodes CNE2, and the second passivation layer PVX2.

The first buffer layer BF1 may be disposed on the substrate SUB. The first buffer layer BF1 may include an inorganic layer that prevents penetration of air or moisture. For example, the first buffer layer BF1 may include a plurality of inorganic layers stacked alternately.

The bottom metal layers BML may be disposed on the first buffer layer BF1. For example, each of the bottom metal layers BML may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The second buffer layer BF2 may cover the first buffer layer BF1 and the bottom metal layers BML. The second buffer layer BF2 may include an inorganic layer that prevents penetration of air or moisture. For example, the second buffer layer BF2 may include a plurality of inorganic layers stacked alternately.

The thin-film transistors TFT may be disposed on the second buffer layer BF2 and may form respective pixel circuits of pixels. For example, each of the thin-film transistors TFT may be a driving transistor or a switching transistor of a pixel circuit. Each of the thin-film transistors TFT may include a semiconductor layer ACT, a source electrode SE, a drain electrode DE, and a gate electrode GE.

The semiconductor layer ACT may be disposed on the second buffer layer BF2. The semiconductor layer ACT may overlap a bottom metal layer BML and the gate electrode GE in the third direction Z (e.g., thickness direction) and may be insulated from the gate electrode GE by the gate insulating layer GI. In a portion of the semiconductor layer ACT, the material of the semiconductor layer ACT may be processed/formed to have conductivity to form the source electrode SE and the drain electrode DE.

The gate electrode GE may be disposed on the gate insulating layer GI. The gate electrode GE may overlap the semiconductor layer ACT with the gate insulating layer GI interposed between the gate electrode GE and the semiconductor layer ACT.

The gate insulating layer GI may be disposed on the semiconductor layers ACT. For example, the gate insulating layer GI may cover the semiconductor layers ACT and the second buffer layer BF2 and may insulate the semiconductor layers ACT from the gate electrodes GE. The gate insulating layer GI may include contact holes through which the first connection electrodes CNE1 extend/pass.

The first interlayer insulating layer ILD1 may cover the gate electrodes GE and the gate insulating layer GI. The first interlayer insulating layer ILD1 may include contact holes through which the first connection electrodes CNE1 extend/pass. The contact holes of the first interlayer insulating layer ILD1 may be connected to the contact holes of the gate insulating layer GI and contact holes of the second interlayer insulating layer ILD2.

The capacitor electrodes CPE may be disposed on the first interlayer insulating layer ILD1. The capacitor electrodes CPE may overlap the gate electrodes GE in the third direction Z (e.g., thickness direction). The capacitor electrodes CPE and the gate electrodes GE may form capacitances/capacitors.

The second interlayer insulating layer ILD2 may cover the capacitor electrodes CPE and the first interlayer insulating layer ILD1. The second interlayer insulating layer ILD2 may include contact holes through which the first connection electrodes CNE1 extend/pass. The contact holes of the second interlayer insulating layer ILD2 may be connected to the contact holes of the first interlayer insulating layer ILD1 and the contact holes of the gate insulating layer GI.

The first connection electrodes CNE1 may be disposed on the second interlayer insulating layer ILD2. The first connection electrodes CNE1 may connect (e.g., electrically connect) the drain electrodes DE of the thin-film transistors TFT to the second connection electrodes CNE2. The first connection electrodes CNE1 may be inserted into the contact holes provided in the second interlayer insulating layer ILD2, the first interlayer insulating layer ILD1 and the gate insulating layer GI to contact the drain electrodes DE of the thin-film transistors TFT.

The first passivation layer PVX1 may cover the first connection electrodes CNE1 and the second interlayer insulating layer ILD2. The first passivation layer PVX1 may protect the thin-film transistors TFT. The first passivation layer PVX1 may include contact holes through which the second connection electrodes CNE2 extend/pass.

The second connection electrodes CNE2 may be disposed on the first passivation layer PVX1. The second connection electrodes CNE2 may connect (e.g., electrically connect) the first connection electrodes CNE1 to first pixel electrodes AE1 of first light emitting elements ED1. The second connection electrodes CNE2 may be inserted into the contact holes provided in the first passivation layer PVX1 to contact the first connection electrodes CNE1.

The second passivation layer PVX2 may cover the second connection electrodes CNE2 and the first passivation layer PVX1. The second passivation layer PVX2 may include contact holes through which the first pixel electrodes AE1 of the first light emitting elements ED1 extend/pass.

The light emitting element layer EML may be disposed on the thin-film transistor layer TFTL. The light emitting element layer EML may include the first light emitting elements ED1 and the first pixel defining layer PDL1. Each of the first light emitting elements ED1 may include a first pixel electrode AE1, a first light emitting layer EL1, and a common electrode CE.

The first pixel electrode AE1 may be disposed on the second passivation layer PVX2. The first pixel electrode AE1 may overlap any one of openings defined by the first pixel defining layer PDL1. The first pixel electrode AE1 may be connected (e.g., electrically connected) to the drain electrode DE of a thin-film transistor TFT through a first connection electrode CNE1 and a second connection electrode CNE2.

A first opening OP1 may expose a portion of the first pixel electrode AE1. The first pixel defining layer PDL1 may include first openings OP1. The first openings OP1 may define the first through fourth light emitting units RE1, GE11, BE1 and GE12, respectively, and their areas or sizes may be different from each other. The first pixel defining layer PDL1 may overlap the first light blocking area BA1 and may be disposed on the second passivation layer PVX2 and a portion of each first pixel electrode AE1.

The first pixel defining layer PDL1 may separate and insulate the respective first pixel electrodes AE1 of the first light emitting elements ED1 from each other. The first pixel defining layer PDL1 may include a light absorbing material to prevent reflection of light. For example, the first pixel defining layer PDL1 may include carbon black. The first pixel defining layer PDL1 including carbon black may include black color and may absorb light reflected by electrodes.

The first light emitting layer EL1 may be disposed on the first pixel electrode AE1 and a portion of the first pixel defining layer PDL1. For example, the first light emitting layer EL1 may be disposed on a surface of the first pixel electrode AE1 and a portion of the first pixel defining layer PDL1 exposed by each first opening OP1 formed by the first pixel defining layer PDL1.

The first light emitting layer EL1 may be an organic light emitting layer made of an organic material. In case that the first light emitting layer EL1 is an organic light emitting layer, in case that a thin-film transistor TFT applies a certain voltage to the first pixel electrode AE1 of a first light emitting element ED1 and the common electrode CE receives a common voltage or a cathode voltage, the first light emitting layer EL1 may emit light.

The common electrode CE may be disposed on the first light emitting layer EL1 in each first emission area PA1 and may be disposed on the first pixel defining layer PDL1 in the first light blocking area BA1. For example, the common electrode CE may be disposed on the first light emitting layer EL1 and a portion of the first pixel defining layer PDL1 on which the first light emitting layer EL1 is not disposed. For example, the common electrode CE may be formed in the entire display area DA in the form of an electrode common to all pixels without distinction between the pixels.

The common electrode CE may receive a common voltage or a low potential voltage. In case that the first pixel electrode AE1 receives a voltage corresponding to a data voltage and the common electrode CE receives a low potential voltage, a potential difference may be formed between the first pixel electrode AE1 and the common electrode CE such that the first light emitting layer EL1 may emit light according to the potential difference.

The thin-film encapsulation layer TFEL may be disposed on the common electrode CE to cover the first light emitting elements ED1. In some embodiments, the thin-film encapsulation layer TFEL may include at least one inorganic layer and at least one organic layer to prevent penetration of foreign substances such as oxygen, moisture or dust into the light emitting element layer EML.

In an embodiment, the thin-film encapsulation layer TFEL may include the first thin-film encapsulation layer TFE1, the second thin-film encapsulation layer TFE2, and the third thin-film encapsulation layer TFE3 sequentially stacked in a third direction Z. The first thin-film encapsulation layer TFE1 and the third thin-film encapsulation layer TFE3 may be inorganic layers, and the second thin-film encapsulation layer TFE2 disposed between the first thin-film encapsulation layer TFE1 and the third thin-film encapsulation layer TFE3 may be an organic layer.

Each of the first thin-film encapsulation layer TFE1 and the third thin-film encapsulation layer TFE3 may include one or more inorganic insulating materials. For example, the inorganic insulating materials may include aluminum oxide, titanium oxide, tantalum oxide, hafnium oxide, zinc oxide, silicon oxide, silicon nitride, and/or silicon oxynitride.

The second thin-film encapsulation layer TFE2 may include a polymer-based material. Examples of the polymer-based material may include acrylic resin, epoxy resin, polyimide, and polyethylene. For example, the second thin-film organic encapsulation layer TFE2 may include acrylic resin such as polymethyl methacrylate or polyacrylic acid. The second thin-film encapsulation layer TFE2 may be formed by curing monomers or applying a polymer.

The first overcoat layer OC1 may be disposed on the third thin-film encapsulation layer TFE3. The first overcoat layer OC1 may have a relatively lower dielectric constant than the second thin-film encapsulation layer TFE2 to increase the sensitivity of the touch electrode layer TSL which will be described below. For example, the dielectric constant of the first overcoat layer OC1 may be about 2 F/m, but embodiments are not limited thereto.

The touch electrode layer TSL may be disposed on the first overcoat layer OC1. The touch electrode layer TSL may include the touch insulating layer TIL and the touch electrodes TE.

The touch electrodes TE may include driving electrodes and sensing electrodes. Each of the driving electrodes and the sensing electrodes may be formed as a single layer of molybdenum (Mo), titanium (Ti), copper (Cu), aluminum (Al) or indium tin oxide (ITO) or may be formed as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The touch insulating layer TIL may include an inorganic layer and/or an organic layer and may cover the touch electrodes TE.

The touch insulating layer TIL may have an insulating function and an optical function, and may include, for example, an inorganic layer including at least one of a silicon nitride layer, a silicon oxynitride layer, a silicon oxide layer, a titanium oxide layer and an aluminum oxide layer.

The color filter layer CFL may be disposed on the touch insulating layer TIL and may include color filters CF and the light blocking pattern layer BM.

The light blocking pattern layer BM may be positioned on the touch insulating layer TIL to overlap the first light blocking area BA1. The light blocking pattern layer BM may include a light absorbing material. For example, the light blocking pattern layer BM may include an inorganic black pigment or an organic black pigment. The inorganic black pigment may be carbon black, and the organic black pigment may include at least one of lactam black, perylene black, and aniline black, but embodiments are not limited thereto. The light blocking pattern layer BM may prevent intrusion of light between the first through fourth light emitting units RE1, GE11, BE1 and GE12 to prevent color mixing, thereby improving the color gamut of the display device 10.

In some embodiments, a width W-BM of the light blocking pattern layer BM in the first direction X may be smaller than a width W-PDL1 of the first pixel defining layer PDL1 in the first direction X. For example, the light blocking pattern layer BM and the first pixel defining layer PDL1 may overlap each other in the first light blocking area BA1, and end portions (e.g., opposite end portions) of the first pixel defining layer PDL1 in the first direction X may protrude further toward the first emission areas PA1 than end portions (e.g., opposite end portions) of the light blocking pattern layer BM.

In some embodiments, the light blocking pattern layer BM which neighbor each other in the first direction X may define second openings OP2, and the light blocking pattern layer BM may be positioned between two neighboring second openings OP2. A width W2 of each second opening OP2 formed by the light blocking pattern layers BM may be greater than a width W1 of each first opening OP1 defined by the first pixel defining layer PDL1.

In some embodiments, the first pixel defining layer PDL1 and the light blocking pattern layer BM may block some of the light emitted from the light emitting element layer EML. Accordingly, only light having a light path that does not overlap the first pixel defining layer PDL1 and the light blocking pattern layers BM may be emitted to the outside of the display device 10. Therefore, the width W1 of each first opening OP defined by the first pixel defining layer PDL1 and the width W2 of each second opening OP2 defined by the light blocking pattern layers BM may be formed to ensure a maximum amount of light that is emitted from the first display area DA1 to the outside of the display device 10.

For example, in case that the width W2 of each second opening OP2 is greater than the width W1 of each first opening OP1 in the first display area DA1 of the display device 10, light emitted from the first emission areas PA1 may be visible to a user not only from the front but also from the side without being blocked or absorbed.

In some embodiments, a first color filter CF1 and a second color filter CF2 of the color filter layer CFL may be disposed on the light blocking pattern layer BM and the touch insulating layer TIL. The first color filter CF1 and the second color filter CF2 may correspond to different light emitting units RE1, GE11, BE1 and GE12 or the second openings OP2 formed in the light blocking pattern layer BM, respectively.

In some embodiments, the first color filter CF1 may selectively transmit light of the first color (e.g., red) and block or absorb light of the third color (e.g., blue) and light of the second color (e.g., green). For example, the first color filter CF1 may be a red color filter and may include a red colorant, but embodiments are not limited thereto.

In some embodiments, the second color filter CF2 may selectively transmit light of the second color (e.g., green) and block or absorb light of the third color (e.g., blue) and light of the first color (e.g., red). For example, the second color filter CF2 may be a green color filter and may include a green colorant, but embodiments are not limited thereto.

The second overcoat layer OC2 may be disposed on the color filter layer CFL. The second overcoat layer OC2 may be a colorless light-transmitting layer having no visible light band color. For example, the second overcoat layer OC2 may include a colorless light-transmitting organic material such as acrylic resin.

Figure 7:
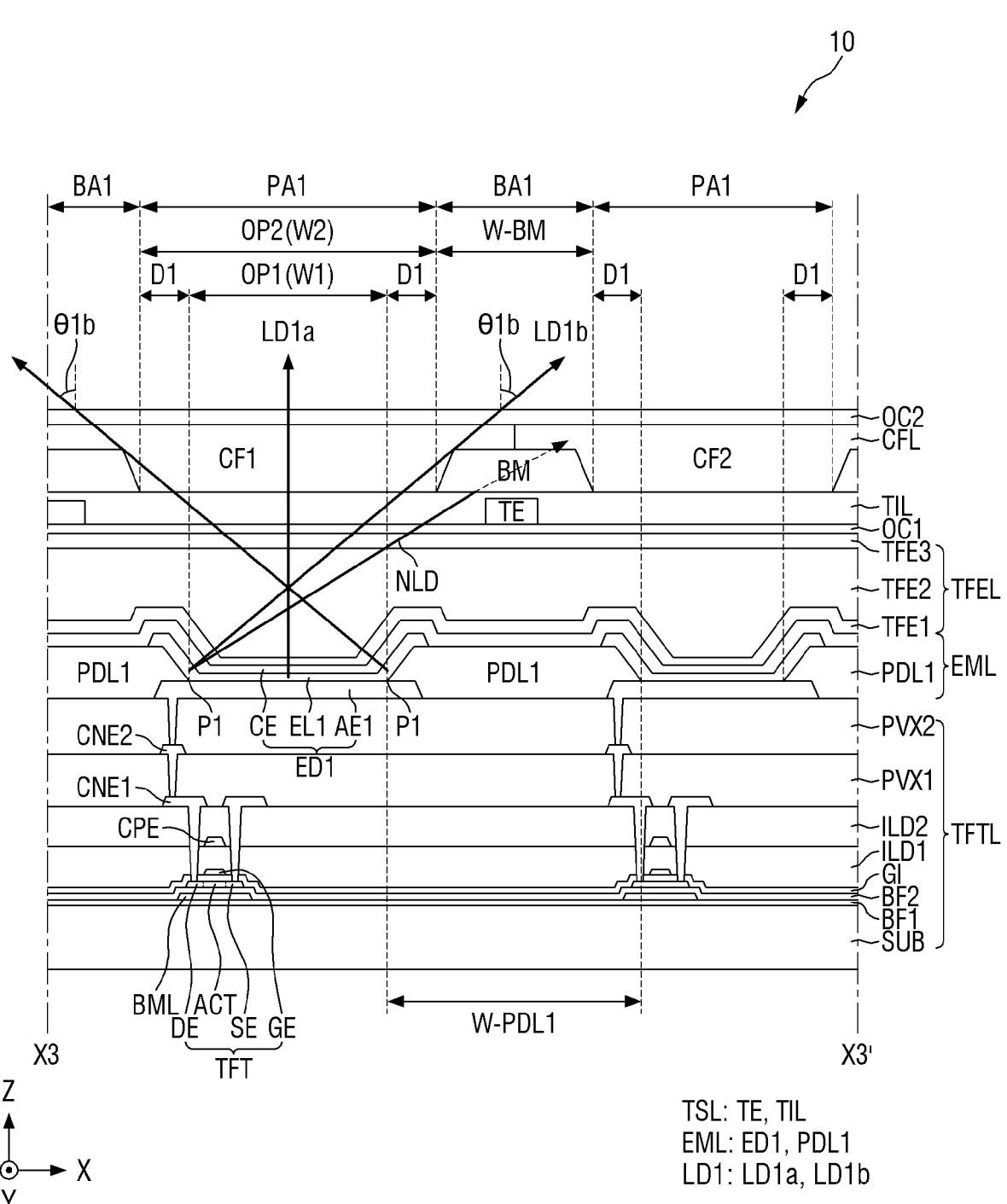
FIG. 7 is a schematic cross-sectional view illustrating paths of light in the first display area of the display device of FIG. 6.
Figure 8:
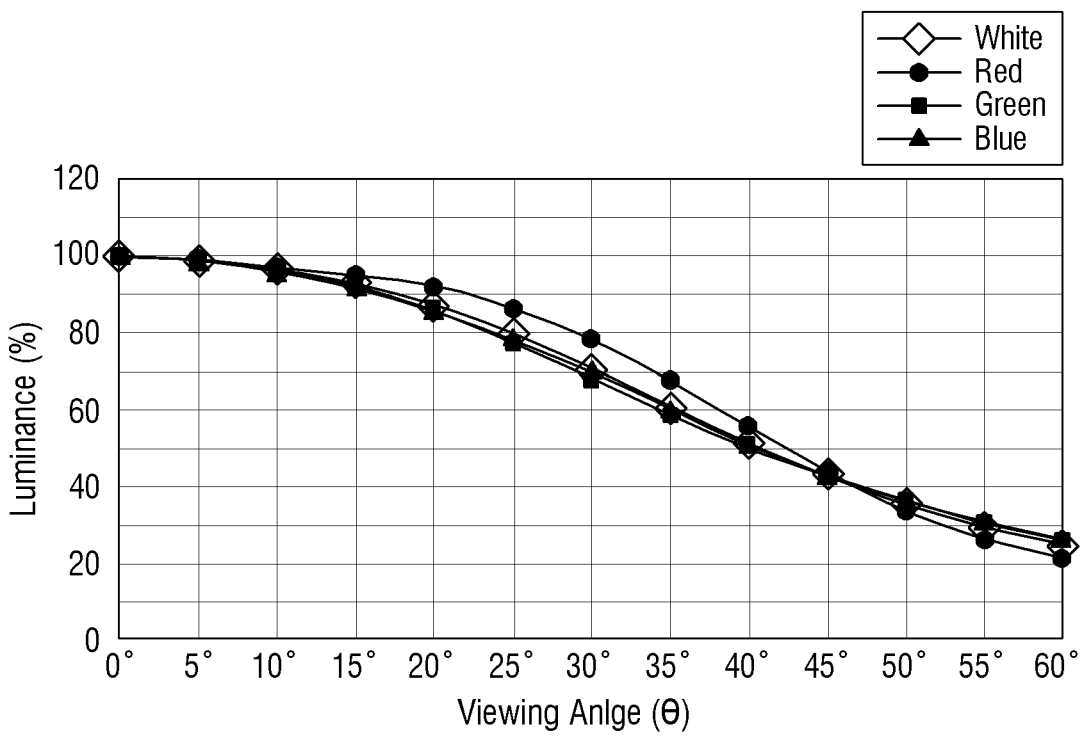
FIG. 8 is a schematic graph illustrating the correlation between viewing angle and luminance.

FIG. 7 is a schematic cross-sectional view illustrating paths of light emitted from the first display area DA1 of the display device 10 of FIG. 6. FIG. 8 is a graph illustrating the correlation between viewing angle ($\theta$) and luminance (%).

Referring to FIG. 7, light emitted from a first light emitting layer EL1 positioned in the first display area DA1 of the display device 10 may transmit/emit in various directions within a range formed by the width W1 of a first opening OP1 defined by the first pixel defining layer PDL1 and the width W2 of a second opening OP2 defined by the light blocking pattern layer BM. For example, light emitted from the first light emitting layer EL1 to the outside of the display device 10 may be defined as light emitted along first light paths LD1.

In some embodiments, the first light paths LD1 may include paths of straight light LD1$a$ and first oblique light LD1$b$.

In some embodiments, the straight light LD1$a$ included in the first light paths LD1 may include all light emitted from the first light emitting layer EL1 and traveling (or transmitting) along a path parallel to the third direction Z. For descriptive convenience, the straight light LD1$a$ is illustrated as light traveling (or transmitting) straight from a central portion of a first light emitting element ED1. However, embodiments are not limited thereto, and the straight light LD1$a$ may include all light emitted from the first light emitting layer EL1 which overlaps the first opening OP1 and travelling (or transmitting) along a path parallel to the third direction Z.

In some embodiments, the first oblique light LD1$b$ included in the first light paths LD1 may include all light emitted from the first light emitting layer EL1 to the outside of the display device 10 along a path oblique to the third direction Z. For example, light emitted to the outside of the display device 10 along a path other than the path of the straight light LD1$a$ among the first light paths LD1 may be output at various angles to the third direction Z on a surface of the display device 10.

In some embodiments, an angle formed on the surface of the display device 10 facing the outside by light emitted from the first light emitting layer EL1 to the outside of the display device 10 and a straight line parallel to the third direction Z may be defined as a viewing angle $\theta$. For example, an angle formed on a surface of the second overcoat layer OC2 by light emitted from the first light emitting layer EL1 in the first display area DA1 along a first light path LD1 and a straight line parallel to the third direction Z may be defined as the viewing angle $\theta$.

For example, since light emitted along the path of the straight light LD1$a$ among the first light paths LD1 is emitted in a direction parallel to the third direction Z, the viewing angle $\theta$ may be shown as about 0 degree. For example, since light emitted along the path of the first oblique light LD1$b$ among the first light paths LD1 is emitted in a direction oblique to the third direction Z, the light may be emitted to the outside of the display device 10 with various viewing angles $\theta$.

In some embodiments, light emitted from the first light emitting layer EL1 along the first light paths LD1 may be defined as light emitted to the outside of the display device 10. For example, light emitted from the first light emitting layer EL1 but being blocked/extinct/absorbed by being blocked by the first pixel defining layer PDL1 and the light blocking pattern layer BM may not be defined as light having the first light paths LD1, but may be defined as extinct light NLD as illustrated in FIG. 7. Therefore, light defined as the extinct light NLD may not be emitted as light that forms the viewing angle θ on the surface of the display device 10 facing the outside after being emitted from the first light emitting layer EL1.

As illustrated in FIG. 7, a point where a first pixel electrode AE1 and an end portion of the first pixel defining layer PDL1 contact each other in a first emission area PA1 may be defined as a first point P1.

In some embodiments, light emitted from the first light emitting layer EL1 which overlaps the first point P1 in the third direction Z and travelling (or transmitting) along the path of the first oblique light LD1$b$ included in the first light paths LD1 may include light having a first maximum viewing angle θ1$b$. For example, among light emitted from the first light emitting layer EL1 to the outside of the display device 10 along the path of the first oblique light LD1$b$, light emitted at an angle greater than the first maximum viewing angle θ1$b$ may be blocked/absorbed to be the extinct light NLD by failing to be emitted to the outside. For example, the largest viewing angle θ of light emitted from the first display area DA1 of the display device 10 to the outside may be the first maximum viewing angle θ1$b$.

In the graph of FIG. 8, the x-axis represents the viewing angle θ, and the y-axis represents the change (%) in luminance with respect to the viewing angle θ.

As illustrated in FIG. 8, the luminance of light emitted from the first light emitting layer EL1 may decrease as the viewing angle θ increases. As shown in the graph, the luminance may be lowered in case that a user views the display device 10 from the side than from the front. For example, in case that light emitted from the first light emitting layer EL1 is red light, the luminance of the red light at the viewing angle θ of about 30 degrees may be about 80% of the luminance of the red light at the viewing angle θ of about 0 degree. The luminance of the red light at the viewing angle θ of about 45 degrees may be about 40% of the luminance of the red light at the viewing angle θ of about 0 degree. In case that the light emitted from the first light emitting layer EL1 is green light, the luminance of the green light at the viewing angle θ of about 25 degrees may be about 80% of the luminance of the green light at the viewing angle θ of about 0 degree.

In the display device 10 according to the embodiment, it can be defined that in case that the viewing angle θ of light emitted from the first light emitting layer EL1 is about 45 degrees, in case that the light has a luminance corresponding to 40% or more of the luminance in case that the viewing angle θ is about 0 degree, a user can fully recognize the light emitted to the outside of the display device 10 even from the side.

Therefore, it may be important to form the width W1 of each first opening OP1 and the width W2 of each second opening OP2 such that in case that the viewing angle θ of light emitted from the first light emitting layer EL1 is about 45 degrees, the luminance of the light at the viewing angle θ of about 45 degrees may be at least 40% of the luminance of the light at the viewing angle θ of about 0 degree.

A gap between a side of the first pixel defining layer PDL1 in the first direction X and a side of the light blocking pattern layer BM in the first direction X may be defined as a first gap D1. The first gap D1 may affect the side luminance and external light reflectance of the first display area DA1 included in the display device 10. For example, as the first gap D1 increases, the width W-BM of the light blocking pattern layer BM may decrease, and the width W2 of each second opening OP2 may increase. Accordingly, the side luminance may be improved. However, since the external light reflectance increases as the second openings OP2 become wider, the display device 10 may be vulnerable to color separation of reflected light. Therefore, it may be important to maintain an appropriate range of the first gap D1 in consideration of external light reflectance characteristics that are opposite to an increase in side luminance. For example, the first gap D1 of the display device 10 may be about 5.0 μm to about 6.0 μm, but embodiments are not limited thereto.

FIG. 9 is a schematic cross-sectional view of an embodiment of the display device 10, taken along line X2-X2' of FIG. 5.

As illustrated in FIG. 9, the second display area DA2 may include the second emission areas PA2, the second light blocking area BA2, and the transmissive area TA. The transmissive area TA of the second display area DA2 may overlap the optical device CM, and the second display area DA2 may have higher light transmittance than the first display area DA1.

Figure 10:
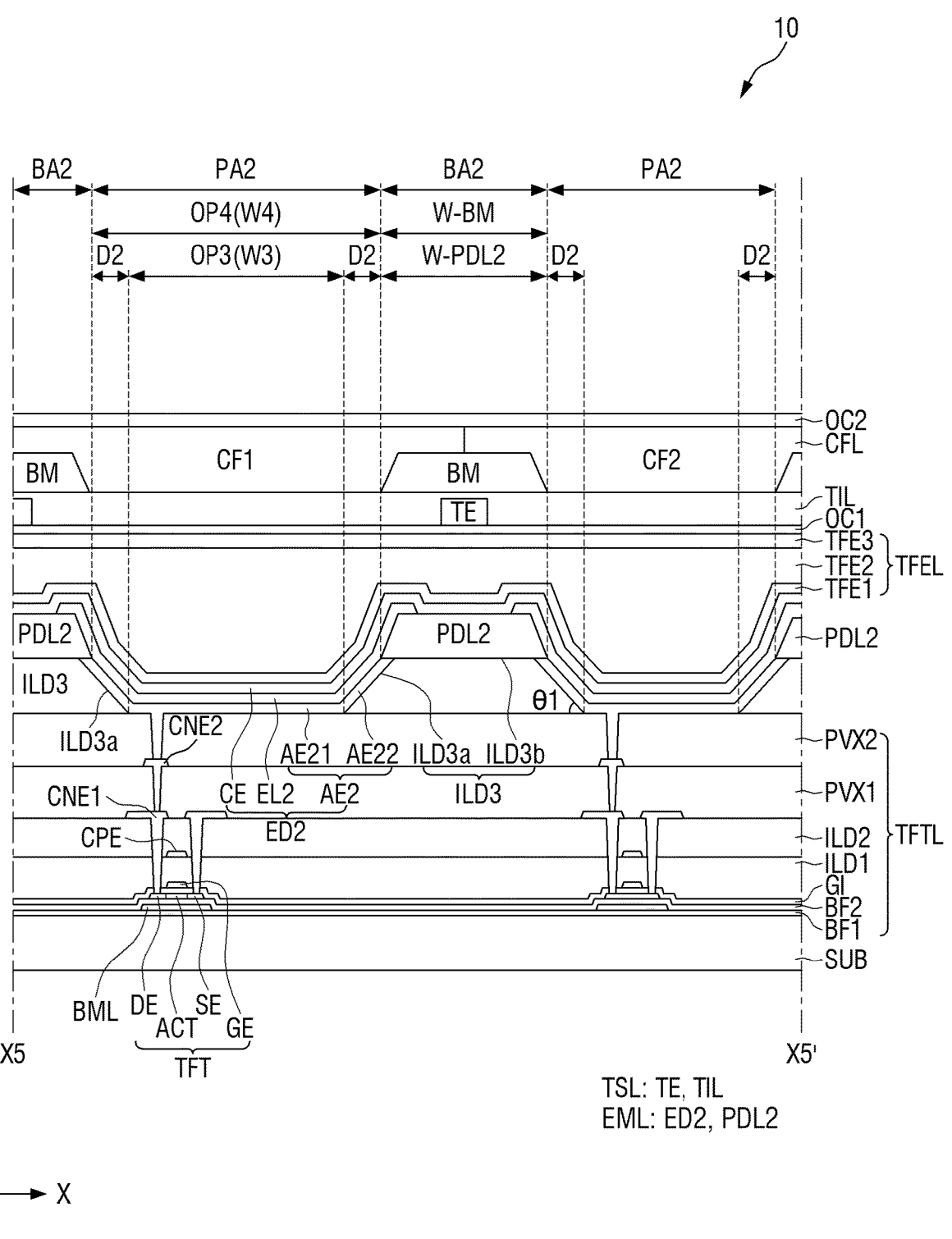
FIG. 10 is a schematic cross-sectional view of an embodiment of the display device, taken along line X5-X5' of FIG. 5.

As illustrated in FIGS. 5, 9 and 10, since the second display area DA2 of the display device 10 further includes the transmissive area TA for increasing transmittance, the arrangement structure of the second pixel areas PX2 may be different from the arrangement structure of the first pixel areas PX1 of the first display area DA1. A description of the second display area DA2 will be omitted because it has already been described above.

Referring to FIG. 10, each second light emitting element ED2 included in the second display area DA2 may include a second pixel electrode AE2, a second light emitting layer EL2, and a common electrode CE.

The second pixel electrode AE2 may be disposed on the second passivation layer PVX2. The second pixel electrode AE2 may be connected (e.g., electrically connected) to a drain electrode DE of a thin-film transistor TFT through a first connection electrode CNE1 and a second connection electrode CNE2.

In some embodiments, unlike in the first display area DA1, in the second display area DA2, a third insulating layer ILD3 may be disposed to overlap the second light blocking area BA2. The third insulating layer ILD3 may be positioned on the second passivation layer PVX2 to overlap the second blocking area BA2.

The third insulating layer ILD3 may define first openings OP3 and may be in contact with the second passivation layer PVX2 and the second pixel electrodes AE2. For example, the third insulating layer ILD3 may be an inorganic layer and may have an insulating function.

In some embodiments, the third insulating layer ILD3 may include a first surface contacting (e.g., directly contacting) the second passivation layer PVX2, a flat surface ILD3$b$ facing the first surface, and inclined surfaces ILD3$a$ connecting the first surface and the flat surface ILD3$b$. The inclined surfaces ILD3$a$ of the third insulating layer ILD3 may overlap the second emission areas PA2.

For example, the second pixel electrode AE2 of each second light emitting element ED2 may include a first portion AE21 contacting (e.g., directly contacting) the second passivation layer PVX2 and a second portion AE22 disposed along the inclined surfaces ILD3$a$ of the third insulating layer ILD3 to contact the inclined surfaces ILD3$a$ of the third insulating layer ILD3.

In some embodiments, an angle formed by the second passivation layer PVX2 and each inclined surface ILD3a of the third insulating layer ILD3 may be defined as a first inclination angle θ1. The first inclination angle θ1 may be an acute angle. The first inclination angle θ1 may be varied to various angles through a process of manufacturing the third insulating layer ILD3.

In some embodiments, the second pixel defining layer PDL2 and the light blocking pattern layer BM may be positioned on the third insulating layer ILD3 to overlap the second light blocking area BA2. The second pixel defining layer PDL2 may include carbon black and may include a light absorbing material to prevent reflection of light.

In some embodiments, in the second display area DA2, the width W-BM of the light blocking pattern layer BM in the first direction X and a width W-PDL2 of the second pixel defining layer PDL2 in the first direction X may be the substantially same as each other. However, there may be a difference within a certain range due to a process error. For example, the process error may be about 2.0 μm or less, and a difference within this process error range may be expressed as being the same. For example, end portions (e.g., opposite end portions) of the light blocking pattern layer BM in the first direction X may be aligned with end portions (e.g., opposite end portions) of the second pixel defining layer PDL2 in the first direction X, but there may be a difference of about 2.0 μm or less according to some process errors.

Figure 11:
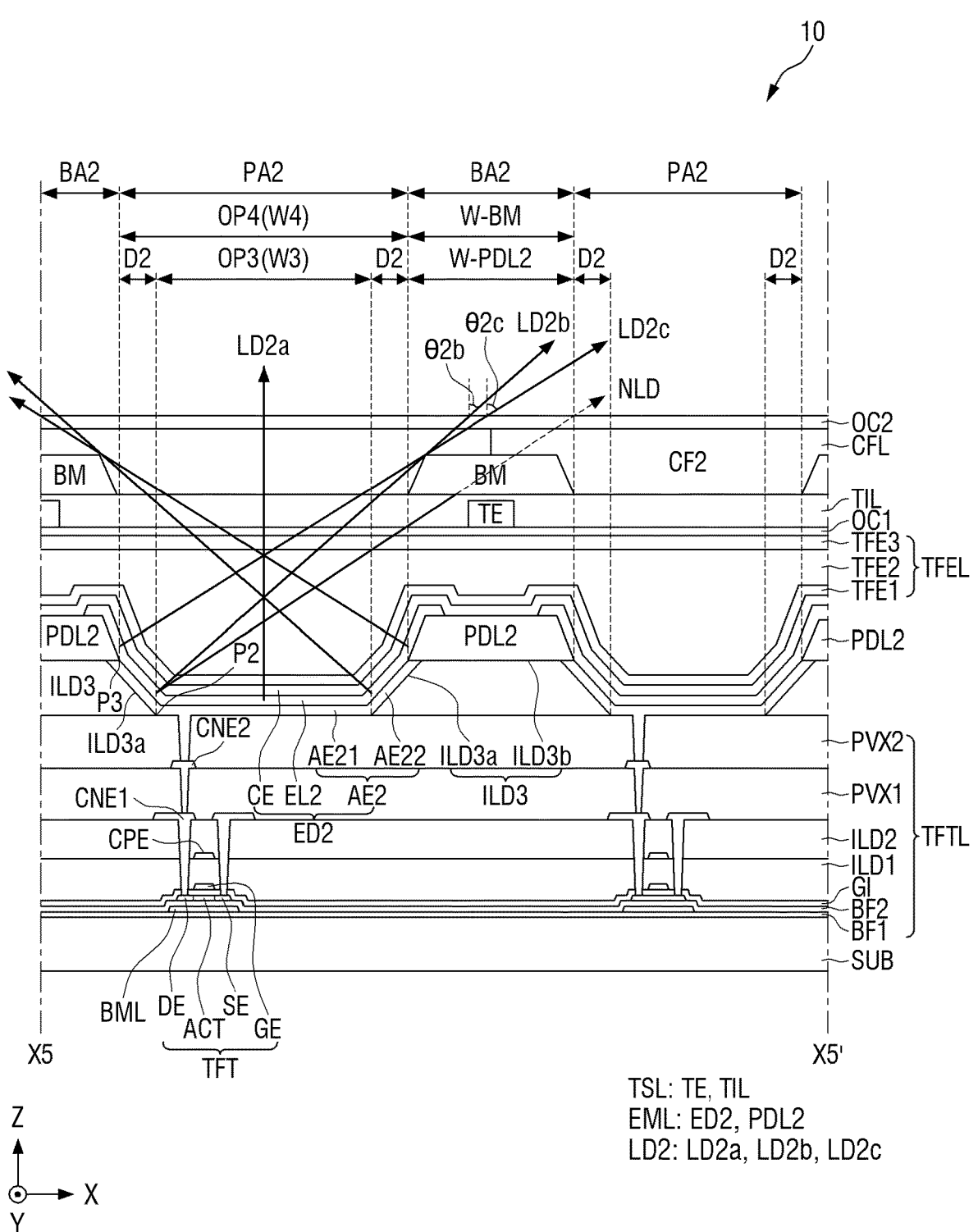
FIG. 11 is a schematic cross-sectional view illustrating paths of light in the second display area of the display device of FIG. 10.
Figure 12:
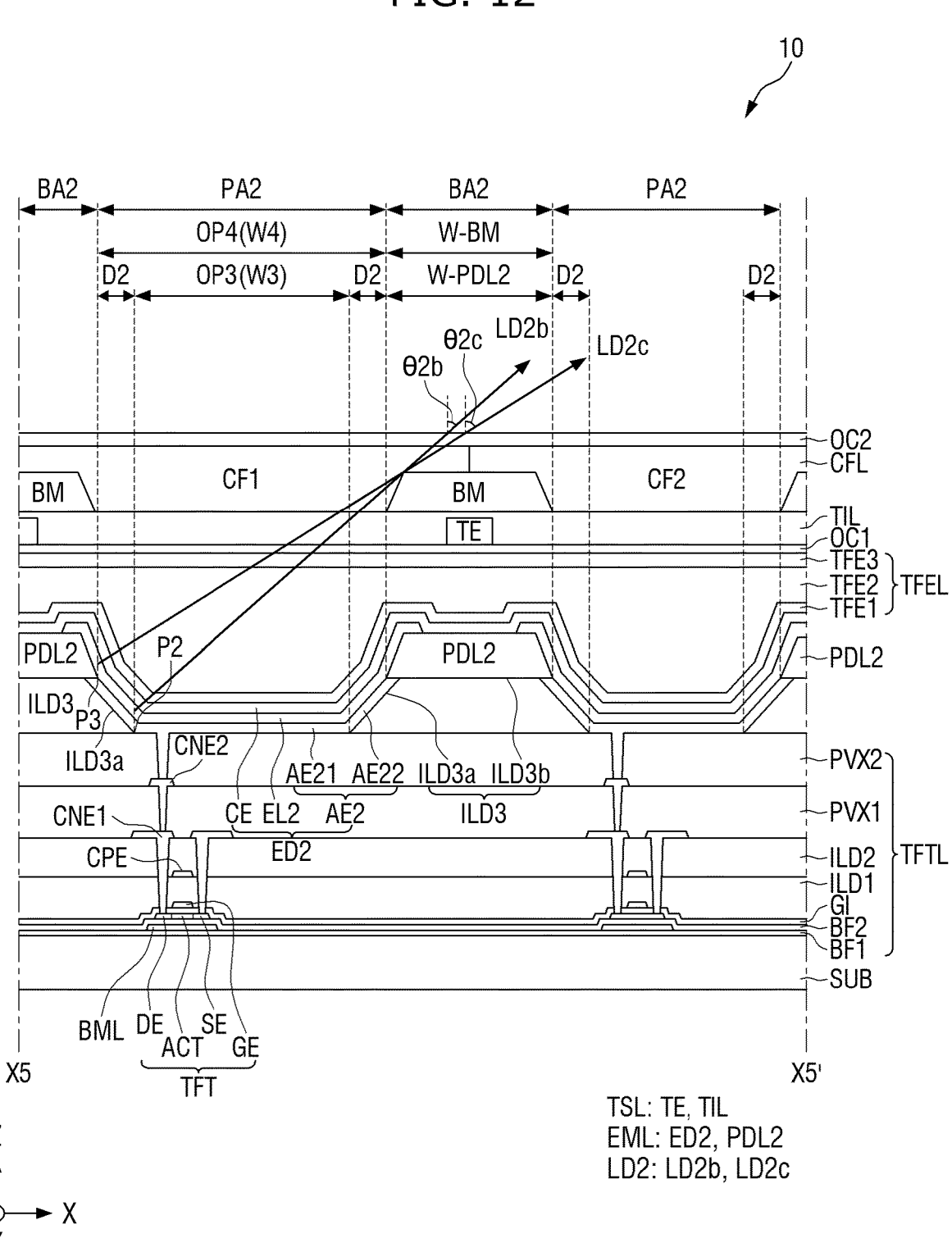
FIG. 12 is a schematic cross-sectional view comparing the paths of light in the second display area of the display device of FIG. 10.

FIGS. 11 and 12 are schematic cross-sectional views illustrating second light paths LD2 included in the second display area DA2 of the display device 10 of FIG. 10.

As illustrated in FIGS. 11 and 12, the light blocking pattern layer BM may include second openings OP4, which are defined by neighboring light blocking pattern layers BM. A width W4 of each second opening OP4 defined by the light blocking pattern layer BM may be greater than a width W3 of each first opening OP3 defined by the third insulating layer ILD3. As mentioned above, in the second display area DA2, the width W-BM of the light blocking pattern layer BM in the first direction X and the width W-PDL2 of the second pixel defining layer PDL2 in the first direction X may be the same as each other. Therefore, the second openings OP4 may also be defined by the second pixel defining layer PDL2. For example, the second openings OP4 in the second display area DA2 may be defined by the light blocking pattern layer BM and the second pixel defining layer PDL2. The second display area DA2 may be different from the first display area DA1 in that the first openings OP1 of the first display area DA1 of the display device 10 are defined by the first pixel defining layer PDL1, but the first openings OP3 of the second display area DA2 are defined by the third insulating layer ILD3.

In some embodiments, since the second pixel defining layer PDL2 and the light blocking pattern layer BM positioned in the second display area DA2 may block some of the light emitted from the light emitting element layer EML, the width W3 of each first opening OP3 defined by the third insulating layer ILD3 and the width W4 of each second opening OP4 defined by the light blocking pattern layer BM may be formed to ensure a maximum amount of light that is emitted to the outside of the display device 10. In some embodiments, light emitted from a second light emitting layer EL2 positioned in the second display area DA2 of the display device 10 may transmit/emit in various directions within a range formed by the width W3 of a first opening OP3 defined by the third insulating layer ILD3 and the width W4 of a second opening OP4 defined by the light blocking pattern layer BM. For example, light emitted from the second light emitting layer EL2 to the outside of the display device 10 may be defined as light emitted along the second light paths LD2.

In some embodiments, the second light paths LD2 may include paths of straight light LD2a, first oblique light LD2b, and second oblique light LD2c.

In some embodiments, the straight light LD2a included in the second light paths LD2 may include all light emitted from the second light emitting layer EL2 which overlaps the first portion AE21 of a second pixel electrode AE2 and travelling (or transmitting) in a direction parallel to the third direction Z. For descriptive convenience, the straight light LD2a is illustrated as light traveling (or transmitting) straight from a central portion of the second light emitting layer EL2, but embodiments are not limited thereto. For example, all the light emitted from the second light emitting layer EL2 which overlaps the first opening OP3 and travelling (or transmitting) in a direction parallel to the third direction Z may be emitted to the outside of the display device 10 along the path of the straight light LD2a included in the second light paths LD2.

In some embodiments, the first oblique light LD2b included in the second light paths LD2 may include all light emitted from the second light emitting layer EL2, which overlaps the first portion AE21 of the second pixel electrode AE2, to the outside of the display device 10 along a path oblique to the third direction Z. For example, among the light emitted from the second light emitting layer EL2 in the second display area DA2 of the display device 10 to the outside of the display device 10, light emitted along the path of the first oblique light LD2b may be output at various angles to the third direction Z on the surface of the display device 10.

In some embodiments, a point where end portions (e.g., opposite end portions) of the first portion AE21 of the second pixel electrode AE2 in the first direction X contact end portions (e.g., opposite end portions) of the third insulating layer ILD3 in the first direction X in each second emission area PA2 may be defined as a first point P2.

In some embodiments, light emitted from the second light emitting layer EL2 which overlaps the first point P2 positioned in the second display area DA2 of the display device 10 in the third direction Z may include light having a first maximum viewing angle θ2b. For example, light output from the second display area DA2 of the display device 10 to the outside of the display device 10 at the first maximum viewing angle θ2b may include light emitted at the largest viewing angle θ among light emitted from the second light emitting layer EL2 overlapping the first portion AE21 of the second pixel electrode AE2. For example, among the light emitted from the second light emitting layer EL2 overlapping the first portion AE21 of the second pixel electrode AE2, light emitted at an angle greater than the first maximum viewing angle θ2b may be blocked/absorbed to be extinct light NLD by failing to be emitted to the outside of the display device 10.

In some embodiments, the second oblique light LD2c included in the second light paths LD2 may include all light emitted from the second light emitting layer EL2, which overlaps the second portion AE22 of the second pixel electrode AE2, to the outside of the display device 10.

In some embodiments, a point where end portions (e.g., opposite end portions) of the second portion AE22 of the second pixel electrode AE2 in the first direction X contact end portions (e.g., opposite end portions) of the second pixel defining layer PDL2 in the first direction X in each second emission area PA2 may be defined as a second point P3.

In some embodiments, light emitted from the second light emitting layer EL2 which overlaps the second point P3 in the second display area DA2 of the display device 10 in a direction perpendicular to the second portion AE22 of the second pixel electrode AE2 may include light having a second maximum viewing angle θ2c. For example, light output from the second display area DA2 of the display device 10 to the outside of the display device 10 at the second maximum viewing angle θ2c may include light emitted at the largest viewing angle θ among light emitted from the second light emitting layer EL2 overlapping the second portion AE22 of the second pixel electrode AE2. Therefore, light emitted along the path of the second oblique light LD2c among the second light paths LD2 may include light having a wider viewing angle θ than light emitted along the path of the first oblique light LD2b.

In some embodiments, a gap between a side of the third insulating layer ILD3 in the first direction X and a side of the light blocking pattern layer BM in the first direction X may be defined as a second gap D2. The second gap D2 may overlap each inclined surface ILD3a of the third insulating layer ILD3.

As mentioned in FIG. 5, the second display area DA2 may include the transmissive area TA for a camera function. Therefore, the second display area DA2 may be different from the first display area DA1 in resolution, pixel shape, and pixel arrangement structure. For example, in order for the second display area DA2 to maintain an appropriate resolution with including the transmissive area TA, a gap between adjacent light emitting units in a single pixel area (e.g., a width of a pixel defining layer disposed between adjacent light emitting units) may be smaller in the second display area DA2 than in the first display area DA1.

Since the second display area DA2 of the display device 10 further includes the transmissive area TA, the second gap D2 of the second display area DA2 may be smaller than the first gap D1 of the first display area DA1. For example, the first gap D1 may have a value of about 5.0 μm to about 6.0 μm, and the second gap D2 may have a value of about 5.0 μm or less, but embodiments are not limited thereto. For example, the second gap D2 may have a value within any range smaller than the first gap D1.

In some embodiments, the first maximum viewing angle θ2b included in light emitted from the second display area DA2 of the display device 10 along the second light paths LD2 may be smaller than the first maximum viewing angle θ1b included in light emitted from the first display area DA1 along the first light paths LD1. Therefore, in case that light emitted from the second light emitting layer EL2 of the display device 10 includes only the first oblique light LD2b among the second light paths LD2, there may be a difference in side visibility between the first display area DA1 and the second display area DA2 of the display device 10. However, since the second light emitting layer EL2 positioned in the second display area DA2 includes light emitted not only along the path of the first oblique light LD2b but also along the path of the second oblique light LD2c, the difference in side visibility between the first display area DA1 and the second display area DA2 may be removed.

For example, the first maximum viewing angle θ1b included in light emitted from the first light emitting layer EL along the first light paths LD1 may be smaller than or equal to the second maximum viewing angle θ2c included in light emitted from the second display area DA2 of the display device 10 along the second light paths LD2. Therefore, in case that the second gap D2 of the second display area DA2 has a smaller value than the first gap D1 of the first display area DA1 to ensure the transmissive area TA, the first display area DA1 and the second display area DA2 may have the same level of a maximum viewing angle. Hence, a user can sufficiently recognize light emitted from the side regardless of the first display area DA1 and the second display area DA2.

As mentioned above, the first inclination angle θ1 included in the third insulating layer ILD3 of the second display area DA2 may be varied to various angles through the process of manufacturing the third insulating layer ILD3. Therefore, an angle formed by the second portion AE22 of the second pixel electrode AE2 and the second passivation layer PVX2 may vary according to the first inclination angle θ1, and the viewing angle θ of light emitted to the outside of the second display area DA2 may be adjusted by adjusting the first inclination angle θ1.

For example, the viewing angle θ of light emitted to the outside of the display device 10 may be changed by adjusting the first inclination angle θ1 as well as the second gap D2.

Figure 13:
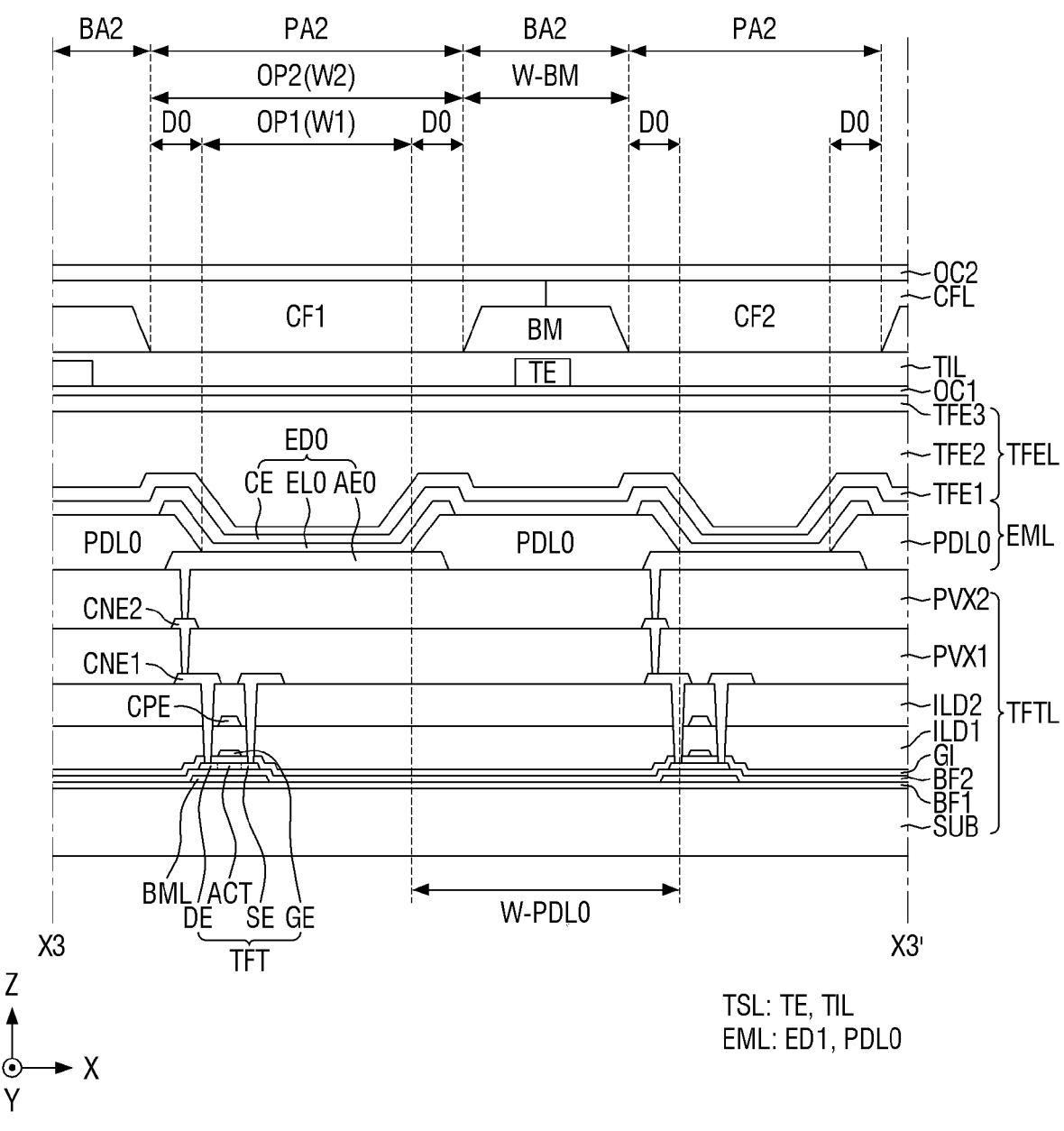
FIG. 13 is a schematic cross-sectional view of a comparative example.
Figure 14:
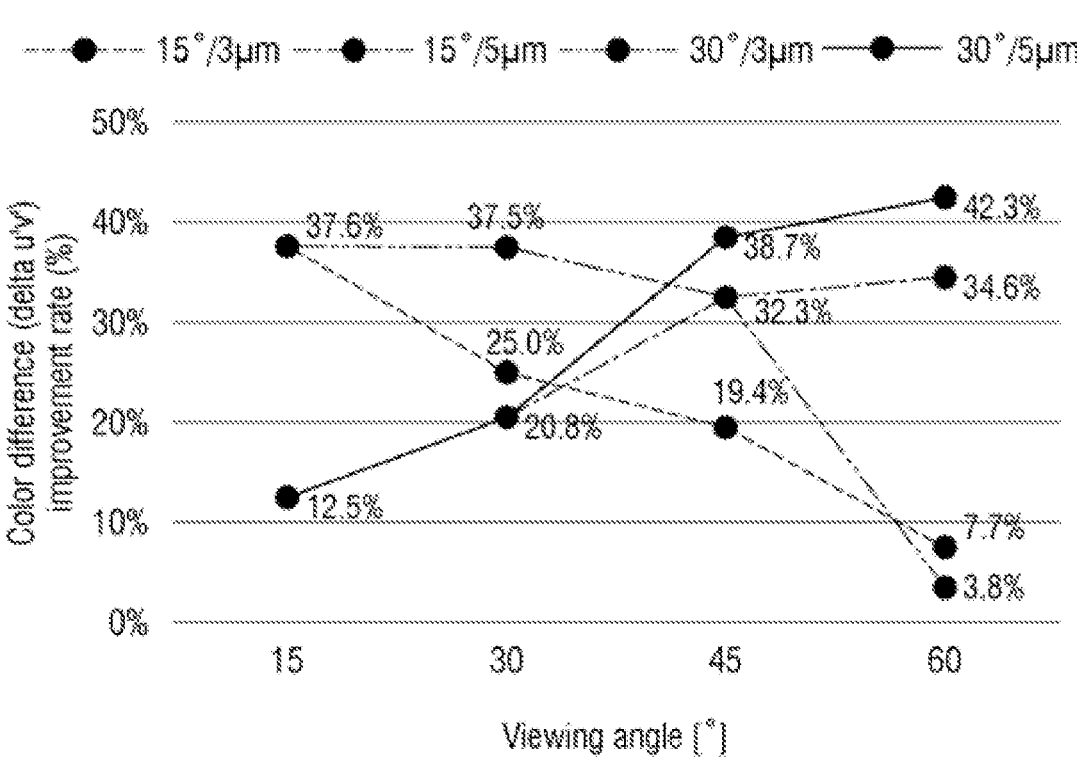
FIG. 14 is a schematic graph illustrating the correlation between a viewing angle and a color difference improvement rate of the display device.

FIG. 13 is a schematic cross-sectional view of a comparative example. FIG. 14 is a graph illustrating the correlation between a viewing angle and a color difference improvement rate of the display device 10.

FIG. 13 is a schematic cross-sectional view of a comparative example for comparing the color difference improvement rate of light emitted from the second display area DA2 of the display device 10 to the outside. For example, the comparative example includes a light emitting element ED0 including a common electrode CE, a light emitting layer EL0, and a pixel electrode AE0. First openings OP1 may be defined by a pixel defining layer PDL0, and second opening OP2 may be defined by a light blocking pattern layer BM. For example, a width W-BM of the light blocking pattern layer BM in the first direction X may be smaller than a width W-PDL0 of the pixel defining layer PDL0 in the first direction X. Since a display device of the comparative example does not include the third insulating layer ILD3, it is different from the second display area DA2 of the display device 10 in that first openings OP1 are defined by a pixel defining layer PDL0 and that a gap DO is defined between an end portion of the pixel defining layer PDL0 in the first direction X and an end portion of a light blocking pattern layer BM in the first direction X.

The rate of color difference improvement from the comparative example according to a change in the second gap D2 and the first inclination angle θ1 of the display device 10 according to an embodiment will be described with reference to FIG. 14. For example, in case that the first inclination angle θ1 is about 15 degrees and the second gap D2 is about 3 μm in the second display area DA2 of the display device 10, the color difference improvement rate may be improved by about 19.4% better than the comparative example, at a viewing angle of about 45 degrees. In case that the first inclination angle θ1 is about 15 degrees and the second gap D2 is about 5 μm, the color difference improvement rate may be improved by about 32.3% better than the comparative example, at a viewing angle of about 45 degrees. For example, in case that the first inclination angle θ1 is about 30 degrees and the second gap D2 is about 3 μm, the color difference improvement rate may be improved by about 32.3% better than the comparative example, at a viewing angle θ of about 45 degrees. In case that the first inclination angle θ1 is about 30 degrees and the second gap D2 is about 5 μm, the color difference improvement rate may be improved by about 38.7% better than the comparative example, at a viewing angle θ of about 45 degrees.

Figure 15:
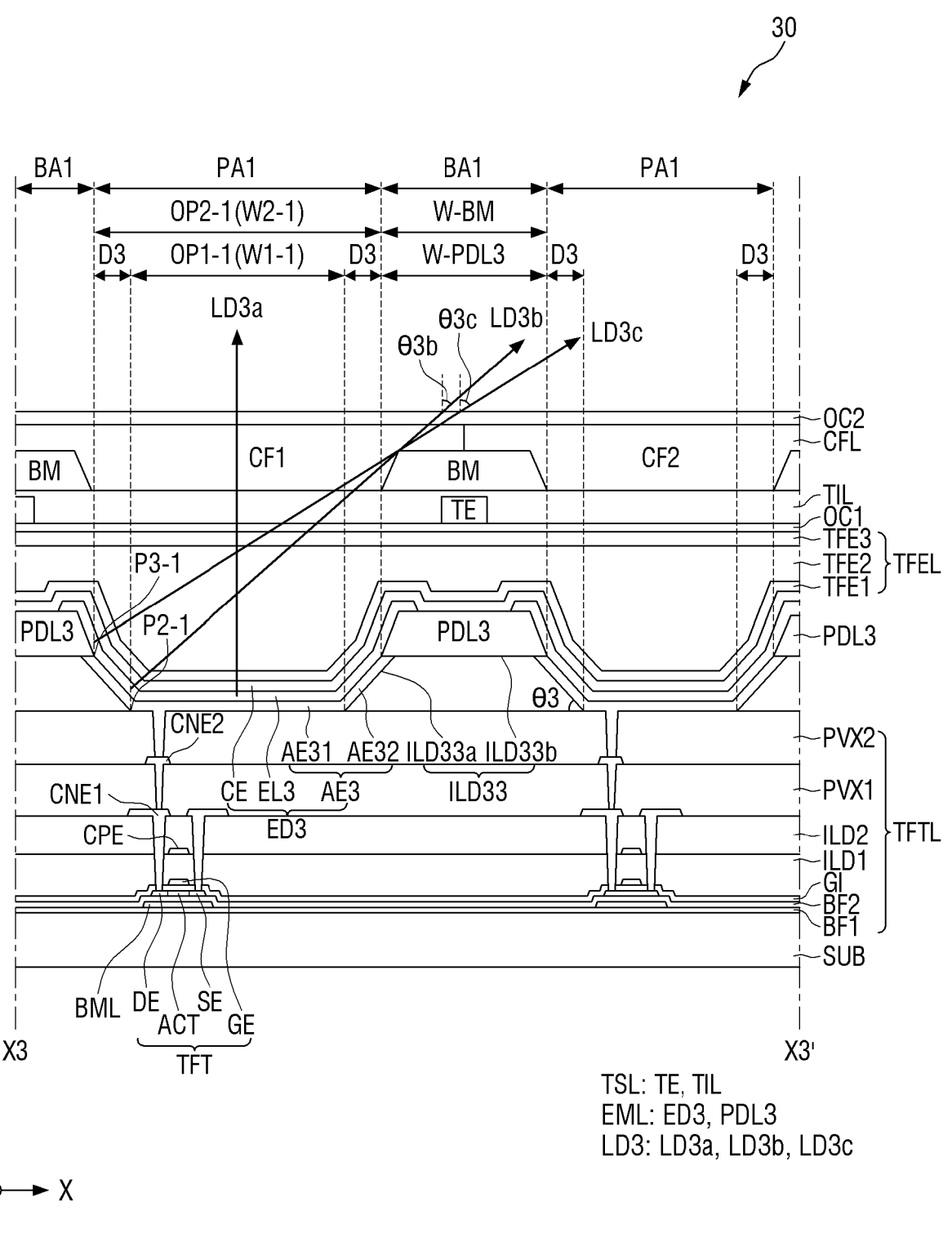
FIG. 15 is a schematic cross-sectional view of a first display area of a display device according to an embodiment, taken along line X3-X3' of FIG. 5.

Although specific angles and specific values have been used for descriptive convenience, embodiments are not limited thereto. FIG. 15 is a schematic cross-sectional view of a first display area DA1 of a display device 30 according to an embodiment, taken along line X3-X3' of FIG. 5.

The first display area DA1 of the display device 30 may be different from the first display area DA1 of the display device 10 in that it includes a $(3-1)^{th}$ insulating layer ILD33.

Each first light emitting element ED3 included in the first display area DA1 of the display device 30 may include a first pixel electrode AE3, a first light emitting layer EL3, and a common electrode CE. The first pixel electrode AE3 of the display device 30 may be disposed on a second passivation layer PVX2. The first pixel electrode AE3 of the display device 30 may be connected (e.g., electrically connected) to a drain electrode DE of a thin-film transistor TFT through a first connection electrode CNE1 and a second connection electrode CNE2.

The first pixel electrode AE3 may include a first portion AE31 contacting (e.g., directly contacting) the second passivation layer PVX2 and a second portion AE32 disposed along inclined surfaces ILD33a of the $(3-1)^{th}$ insulating layer ILD33 to contact the inclined surfaces ILD33a of the $(3-1)^{th}$ insulating layer ILD33.

The $(3-1)^{th}$ insulating layer ILD33 may define first openings OP1-1 and may contact the second passivation layer PVX2 and the second portion AE32 of the first pixel electrode AE3. The $(3-1)^{th}$ insulating layer ILD33 may include a first surface contacting (e.g., directly contacting) the second passivation layer PVX2, a flat surface ILD33b facing the first surface, and the inclined surfaces ILD33a connecting the first surface and the flat surface ILD33b.

The $(3-1)^{th}$ insulating layer ILD33 may be an inorganic layer and may have an insulating function.

A first pixel defining layer PDL3 and a light blocking pattern layer BM may be disposed on the $(3-1)^{th}$ insulating layer ILD33 to overlap a first light blocking area BA1. The first pixel defining layer PDL3 may include carbon black and may include a light absorbing material to prevent reflection of light.

In the first display area DA1 of the display device 30, a width W-BM of the light blocking pattern layer BM in the first direction X and a width W-PDL3 of the first pixel defining layer PDL3 in the first direction X may be the same as each other, but there may be a difference within a certain range due to a process error. For example, the process error may be about 2.0 µm or less. For example, end portions (e.g., opposite end portions) of the light blocking pattern layer BM in the first direction X may be aligned with end portions (e.g., opposite end portions) of the first pixel defining layer PDL3 in the first direction X, but there may be a difference of about 2.0 µm or less according to process errors.

As illustrated in FIG. 15, the light blocking pattern layer BM which neighbor each other in the first direction X in the first display area DA1 may form second openings OP2-1, and a width W2-1 of each second opening OP2-1 formed by the light blocking pattern layer BM may be greater than a width W1-1 of each first opening OP1-1 defined by the $(3-1)^{th}$ insulating layer ILD33. As mentioned above, in the first display area DA1, the width W-BM of the light blocking pattern layer BM in the first direction X and the width W-PDL3 of the first pixel defining layer PDL3 in the first direction X may be the same as each other. Therefore, the second openings OP2-1 may also be defined by the first pixel defining layer PDL3. For example, the second openings OP2-1 in the first display area DA1 may be defined by the light blocking pattern layer BM and the first pixel defining layer PDL3.

In some embodiments, the first openings OP1 may be defined by the first pixel defining layer PDL1 in the first display area DA1 of the display device 10, but the first openings OP1-1 may be defined by the $(3-1)^{th}$ insulating layer ILD33 in the first display area DA1 of the display device 30.

In some embodiments, light emitted from a first light emitting layer EL3 positioned in the first display area DA1 of the display device 30 may transmit/emit in various directions within a range formed by the width W1-1 of a first opening OP1-1 defined by the $(3-1)^{th}$ insulating layer ILD33 and the width W2-1 of a second opening OP2-1 defined by the light blocking pattern layer BM. For example, light emitted from the first light emitting layer EL3 to the outside of the display device 10 may be defined as light emitted along first light paths LD3.

In some embodiments, the first light paths LD3 of the display device 30 may include straight light LD3a, first oblique light LD3b, and second oblique light LD3c.

In some embodiments, the straight light LD3a included in the first light paths LD3 may include all paths of light emitted from the first light emitting layer EL3 which overlaps the first portion AE31 of a first pixel electrode AE3 included in the display device 30 and travelling (or transmitting) in a direction parallel to the third direction Z. For descriptive convenience, the straight light LD3a is illustrated as light traveling (or transmitting) straight from a central portion of the first light emitting layer EL3 which overlaps the first portion AE31 of the first pixel electrode AE3. However, embodiments are not limited thereto, and the straight light LD3a may include all light, which is emitted from the first light emitting layer EL3 overlapping the first opening OP1-1 and travels (or transmits) in a direction parallel to the third direction Z.

In some embodiments, the first oblique light LD3b included in the first light paths LD3 may include all light emitted from the first light emitting layer EL3, which overlaps the first portion AE31 of the first pixel electrode AE3 included in the display device 30, to the outside of the display device 30 along a path oblique to the third direction Z. For example, light emitted to the outside of the display device 30 along the path of the first oblique light LD3b among the first light paths LD3 may be output at various angles to the third direction Z on a surface of the display device 30.

In some embodiments, a point where end portions (e.g., opposite end portions) of the first portion AE31 of the first pixel electrode AE3 in the first direction X contact end portions (e.g., opposite end portions) of the $(3-1)^{th}$ insulating layer ILD33 in the first direction X in the first display area DA1 of the display device 30 may be defined as a first point P2-1.

In some embodiments, light emitted from the first light emitting layer EL3 which overlaps the first point P2-1 positioned in the first display area DA1 of the display device 30 in the third direction Z may include light having a first maximum viewing angle θ3b. For example, light output from the first display area DA1 of the display device 30 to the outside of the display device 30 at the first maximum viewing angle θ3b may include light emitted at the largest viewing angle θ among light emitted from the first light emitting layer EL3 overlapping the first portion AE31 of the first pixel electrode AE3. For example, among the light emitted from the first light emitting layer EL3 overlapping the first portion AE31 of the first pixel electrode AE3, light emitted at an angle greater than the first maximum viewing angle θ3b may be blocked/absorbed to be extinct light NLD by failing to be emitted to the outside of the display device 30.

In some embodiments, the second oblique light LD3c among the first light paths LD3 included in the display device 30 may include all light emitted from the first light emitting layer EL3, which overlaps the second portion AE32 of the first pixel electrode AE3, to the outside of the display device 30.

In some embodiments, a point where end portions (e.g., opposite end portions) of the second portion AE32 of the first pixel electrode AE3 in the first direction X contact end portions (e.g., opposite end portions) of the first pixel defining layer PDL3 in the first direction X in the first display area DA1 of the display device 30 may be defined as a second point P3-1.

In some embodiments, light emitted from the first light emitting layer EL3 which overlaps the second point P3-1 in the first display area DA1 of the display device 30 in a direction perpendicular to the second portion AE32 of the first pixel electrode AE3 may include light having a second maximum viewing angle θ3c. For example, light output from the first display area DA1 of the display device 30 to the outside of the display device 30 at the second maximum viewing angle θ3c may include light emitted at the largest viewing angle θ among light emitted from the first light emitting layer EL3 overlapping the second portion AE32 of the first pixel electrode AE3. For example, among the light emitted from the first light emitting layer EL3 overlapping the first pixel electrode AE3 of the display device 30, light emitted at an angle greater than the second maximum viewing angle θ3c may be blocked/absorbed to be extinct light NLD by failing to be emitted to the outside of the first display area DA1 of the display device 30.

In some embodiments, the first maximum viewing angle θ3b included in light emitted from the first light emitting layer EL3 in the first display area DA of the display device 30 may be smaller than the second maximum viewing angle θ3c. For example, light emitted from the first display area DA1 of the display device 30 along the path of the second oblique light LD3c may include light having a wider viewing angle θ than light emitted along the path of the first oblique light LD3b.

In some embodiments, a gap between a side of the (3-1)$^{th}$ insulating layer ILD33 in the first direction X and a side of the light blocking pattern layer BM in the first direction X may be defined as a first gap D3. The first gap D3 may overlap each inclined surface ILD33a of the (3-1)$^{th}$ insulating layer ILD33.

In some embodiments, an angle formed by the second passivation layer PVX2 and each inclined surface ILD33a of the (3-1)$^{th}$ insulating layer ILD33 may be defined as a first inclination angle θ3. The first inclination angle θ3 may be an acute angle. The first inclination angle θ3 may be varied to various angles through a process of manufacturing the (3-1)$^{th}$ insulating layer ILD33.

Figure 16:
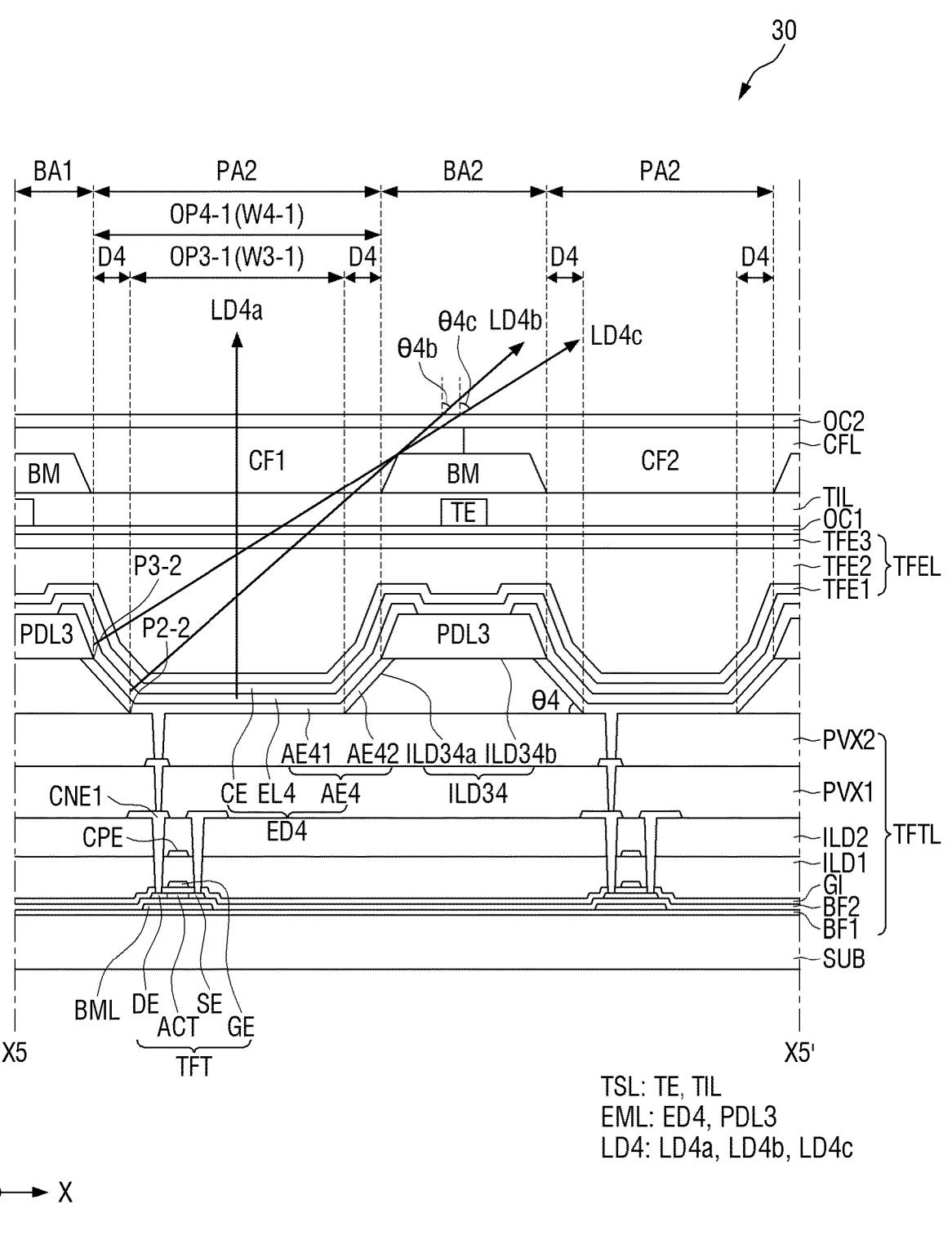
FIG. 16 is a schematic cross-sectional view of a second display area of the display device according to the embodiment, taken along line X5-X5' of FIG. 5.

In some embodiments, an angle formed by the second portion AE32 of the first pixel electrode AE3 and the second passivation layer PVX2 may vary according to the first inclination angle θ3, and the viewing angle θ of light emitted to the outside of the display device 30 may be adjusted by adjusting the first inclination angle θ1. FIG. 16 is a schematic cross-sectional view of a second display area DA2 of the display device 30 according to the embodiment, taken along line X5-X5' of FIG. 5.

In some embodiments, a second pixel electrode AE4 included in the second display area DA2 of the display device 30 may include a first portion AE41 contacting (e.g., directly contacting) the second passivation layer PVX2 and a second portion AE42 disposed along inclined surfaces ILD34a of a (3-2)$^{th}$ insulating layer ILD34 to contact the inclined surfaces ILD34a of the (3-2)$^{th}$ insulating layer ILD34. For example, the (3-2)$^{th}$ insulating layer ILD34 may further include a first surface contacting (e.g., directly contacting) the second passivation layer PVX2 and a flat surface ILD34b facing (or opposite to) the first surface. The inclined surfaces ILD34a may connect the first surface and the flat surface ILD34b.

In some embodiments, light emitted from a second light emitting layer EL4 positioned in the second display area DA2 of the display device 30 may transmit/emit in various directions within a range formed by a width W3-1 of a first opening OP3-1 defined by the (3-2)$^{th}$ insulating layer ILD34 and a width W4-1 of a second opening OP4-1 defined by the light blocking pattern layer BM. For example, light emitted from the second light emitting layer EL4 to the outside of the display device 30 may be defined as light emitted along second light paths LD4.

In some embodiments, the second light paths LD4 of the display device 30 may include straight light LD4a, first oblique light LD4b, and second oblique light LD4c.

In some embodiments, the straight light LD4a included in the second light paths LD4 in the second display area DA2 of the display device 30 may include all light, which is emitted from the second light emitting layer ELA overlapping the first portion AE41 of the second pixel electrode AE4 and travels (or transmits) in a direction parallel to the third direction Z. For descriptive convenience, the straight light LD4a is illustrated as light traveling straight from a central portion of the second light emitting layer EL4 which overlaps the first portion AE41 of the second pixel electrode AE4. However, embodiments are not limited thereto, and the straight light LD4a may include all light emitted from the second light emitting layer EL4 which overlaps each first opening OP3-1 and travelling (or transmitting) in a direction parallel to the third direction Z.

In some embodiments, the first oblique light LD4b included in the second light paths LD4 in the second display area DA2 of the display device 30 may include all light emitted from the second light emitting layer EL4, which overlaps the first portion AE41 of the second pixel electrode AE4, to the outside of the display device 30 along a path oblique to the third direction Z. For example, light emitted to the outside of the display device 30 as the first oblique light LD4b among the second light paths LD4 may be output at various angles to the third direction Z on the surface of the display device 30.

In some embodiments, a point where end portions (e.g., opposite end portions) of the first portion AE41 of the second pixel electrode AE4 in the first direction X contact end portions (e.g., opposite end portions) of the (3-2)$^{th}$ insulating layer ILD34 in the first direction X in the second display area DA2 of the display device 30 may be defined as a second point P2-2.

In some embodiments, light emitted from the second light emitting layer EL4 which overlaps the second point P2-2 positioned in the second display area DA2 of the display device 30 in the third direction Z may include light having a first maximum viewing angle θ4b. For example, light output from the second display area DA2 of the display device 30 to the outside of the display device 30 at the first maximum viewing angle θ4b may include light emitted at the largest viewing angle θ among light emitted from the second light emitting layer EL4 overlapping the first portion AE41 of the second pixel electrode AE4. For example, among the light emitted from the second light emitting layer EL4 overlapping the first portion AE41 of the second pixel electrode AE4, light emitted at an angle greater than the first maximum viewing angle θ4b may be blocked/absorbed to be extinct light NLD by failing to be emitted to the outside of the display device 30.

In some embodiments, the second oblique light LD4c included in the second light paths LD4 of the display device 30 may include all light emitted from the second light emitting layer EL4, which overlaps the second portion AE42 of the second pixel electrode AE4, to the outside of the display device 30.

As illustrated in FIG. 16, a point where end portions (e.g., opposite end portions) of the second portion AE42 of the second pixel electrode AE4 contact end portions (e.g., opposite end portions) of the first pixel defining layer PDL3 in each second emission area PA2 may be defined as a second point P3-2.

In some embodiments, light emitted from the second light emitting layer EL4 which overlaps the second point P3-2 positioned in the second display area DA2 of the display device 30 in a direction perpendicular to the second portion AE42 of the second pixel electrode AE4 may include light having a second maximum viewing angle θ4c. For example, light output from the second display area DA2 of the display device 30 to the outside of the display device 30 at the second maximum viewing angle θ4c may include light emitted at the largest viewing angle θ among light emitted from the second light emitting layer EL4 overlapping the second portion AE42 of the second pixel electrode AE4. For example, among the light emitted from the second light emitting layer EL4 overlapping the second pixel electrode AE4 of the display device 30, light emitted at an angle greater than the second maximum viewing angle θ4c may be blocked/absorbed to be extinct light NLD by failing to be emitted to the outside of the second display area DA2 of the display device 30.

In some embodiments, the first maximum viewing angle θ4b included in light emitted from the second light emitting layer EL4 in the second display area DA2 of the display device 30 may be smaller than the second maximum viewing angle θ4c. For example, all light emitted as the first oblique light LD4b included in the second light paths LD4 in the display device 30 may be included in light emitted as the second oblique light LD4c. However, among the light included in the second oblique light LD4c included in the second light paths LD4 in the display device 30, light emitted at a viewing angle θ greater than the first maximum viewing angle θ4b may not be included in the first oblique light LD4b.

For example, light emitted as the second oblique light LD4c included in the second light paths LD4 in the second display area DA2 of the display device 30 may include the path of light having a wider viewing angle θ than light emitted as the first oblique light LD4b.

In some embodiments, the second display area DA2 of the display device 30 may include a second gap D4 between a side of the (3-2)$^{th}$ insulating layer ILD34 in the first direction X and a side of the light blocking pattern layer BM in the first direction X. The second gap D4 may overlap each inclined surface ILD34a of the (3-2)$^{th}$ insulating layer ILD34.

In some embodiments, the second gap D4 included in the second display area DA2 of the display device 30 may be smaller than or equal to the first gap D3 included in the first display area DA1 of the display device 30.

In some embodiments, an angle formed by the second passivation layer PVX2 and each inclined surface ILD34a of the (3-2)$^{th}$ insulating layer ILD34 may be defined as a second inclination angle θ4. The second inclination angle θ4 may be an acute angle. The second inclination angle θ4 may be varied to various angles through a process of manufacturing the (3-2)$^{th}$ insulating layer ILD34. An angle formed by the second portion AE42 of the second pixel electrode AE4 and the second passivation layer PVX2 may vary according to the second inclination angle θ4, and the viewing angle θ of light emitted to the outside of the display device 30 may be adjusted by adjusting the second inclination angle θ4. The second inclination angle θ4 may be greater than the first inclination angle θ3. For example, the second inclination angle θ4 may be greater than the first inclination angle θ3 by about 15 degrees or more, but embodiments are not limited thereto.

In some embodiments, since the second gap D4 is smaller than or equal to the first gap D3 and the second inclination angle θ4 is greater than the first inclination angle θ3, the second maximum viewing angle θ4c included in the second light paths LD4 in the second display area DA2 of the display device 30 may be equal to or greater than the second maximum viewing angle θ3c included in the first light paths LD3 in the first display area DA1 of the display device 30.

According to a display device according to embodiments, it is possible to improve a luminance difference between a first display area and a second display area according to a viewing angle in a display panel including the first display area and the second display area.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a substrate comprising:
    a first display area comprising a first emission area and a first light blocking area around the first emission area and
    a second display area comprising a second emission area, a second light blocking area around the second emission area, and a transmissive area;
a passivation layer overlapping the first display area and the second display area and disposed on the substrate;
an insulating layer overlapping the second display area and disposed on the passivation layer;
a first light emitting element disposed on the passivation layer and in the first emission area; and
a second light emitting element disposed on the passivation layer and in the second emission area, wherein
the insulating layer comprises:
    a first surface facing the passivation layer,
    a second surface opposite to the first surface, and
    an inclined surface connecting the first surface and the second surface,
the first light emitting element comprises a first pixel electrode disposed on the passivation layer, and
the second light emitting element comprises a second pixel electrode including:
    a first portion disposed on the passivation layer, and a second portion disposed on the inclined surface of the insulating layer.

2. The display device of claim 1, further comprising:
a first pixel defining layer disposed on the passivation layer and the first pixel electrode in the first display area and defining a first opening which exposes at least a portion of the first pixel electrode;
a second pixel defining layer disposed on the insulating layer and the second pixel electrode in the second display area and defining a second opening which exposes at least a portion of the second pixel electrode; and
a light blocking pattern layer overlapping the first pixel defining layer in the first light blocking area and overlapping the second pixel defining layer in the second light blocking area.

3. The display device of claim 2, wherein
the first opening includes a plurality of first openings, and
a width of the first pixel defining layer disposed between two neighboring first openings among the plurality of first openings is greater than a width of the light blocking pattern layer disposed between the two neighboring first openings and overlapping the first pixel defining layer.

4. The display device of claim 3, wherein
the second opening includes a plurality of second openings, and
a width of the second pixel defining layer disposed between two neighboring second openings among the plurality of second openings is substantially equal to a width of the light blocking pattern layer disposed between the two neighboring second openings and overlapping the second pixel defining layer.

5. The display device of claim 4, wherein the first pixel defining layer and the second pixel defining layer comprise a light blocking material.

6. The display device of claim 1, wherein the inclined surface of the insulating layer overlaps the second emission area.

7. The display device of claim 6, wherein a first inclination angle formed by the inclined surface and the first surface of the insulating layer is an acute angle.

8. The display device of claim 2, wherein the insulating layer is disposed between the second pixel defining layer and the passivation layer and is not disposed between the first pixel defining layer and the passivation layer.

9. The display device of claim 2, wherein
the first display area comprises a first gap between an end portion of the first pixel defining layer in a first direction and an end portion of the light blocking pattern layer in the first direction,
the second display area comprises a second gap between an end portion of the insulating layer in the first direction and an end portion of the light blocking pattern layer in the first direction, and
the first gap is greater than the second gap.

10. The display device of claim 9, wherein
the first gap is about 5 μm to about 6 μm, and
the second gap is about 5 μm or less.

11. The display device of claim 1, further comprising:
an optical device disposed in the second display area to overlap the transmissive area.

12. The display device of claim 11, wherein a light transmittance of the second display area is higher than a light transmittance of the first display area.

13. The display device of claim 1, further comprising:

a thin-film encapsulation layer disposed on the first light emitting element and the second light emitting element;
a color filter layer disposed on the thin-film encapsulation layer; and
an overcoat layer and a touch electrode layer disposed between the thin-film encapsulation layer and the color filter layer, wherein
the thin-film encapsulation layer comprises a first inorganic layer, a second inorganic layer and an organic layer disposed between the first inorganic layer and the second inorganic layer,
a dielectric constant of the overcoat layer is lower than a dielectric constant of the second inorganic layer of the thin-film encapsulation layer,
the touch electrode layer comprises a touch electrode, and
the touch electrode overlaps a light blocking pattern layer.

14. A display device comprising:
a substrate comprising:
a first display area comprising a first emission area and a first light blocking area around the first emission area, and
a second display area comprising a second emission area, a second light blocking area around the second emission area, and a transmissive area;
a passivation layer overlapping the first display area and the second display area and disposed on the substrate;
a first insulating layer overlapping the first display area and disposed on the passivation layer;
a second insulating layer overlapping the second display area and disposed on the passivation layer;
a first light emitting element disposed on the passivation layer and in the first emission area; and
a second light emitting element disposed on the passivation layer and in the second emission area, wherein
the first insulating layer comprises:
a first surface facing the passivation layer,
a second surface opposite to the first surface, and
a first inclined surface connecting the first surface and the second surface,
a first inclination angle is formed by the first surface and the first inclined surface,
the second insulating layer comprises:
a third surface facing the passivation layer,
a fourth surface opposite to the third surface, and
a second inclined surface connecting the third surface and the fourth surface,
a second inclination angle is formed by the third surface and the second inclined surface,
the first inclination angle and the second inclination angle are acute angles, and
the second inclination angle is greater than the first inclination angle.

15. The display device of claim 14, wherein the second inclination angle is greater than the first inclination angle by about 15 degrees or more.

16. The display device of claim 14, wherein
the first light emitting element comprises a first pixel electrode,
the second light emitting element comprises a second pixel electrode,
the first pixel electrode comprises:
a first portion facing the passivation layer and
a second portion spaced apart from the passivation layer with the first insulating layer interposed between the passivation layer and the second portion, the second portion contacting the first inclined surface of the first insulating layer, and the second pixel electrode comprises:

a third portion facing the passivation layer, and a fourth portion spaced apart from the passivation layer with the second insulating layer interposed between the passivation layer and the fourth portion, the fourth portion contacting the second inclined surface of the second insulating layer.

17. The display device of claim 16, comprising:

a first pixel defining layer disposed on the first insulating layer and the first pixel electrode in the first display area and defining a first opening which exposes at least a portion of the first pixel electrode;

a second pixel defining layer disposed on the second insulating layer and the second pixel electrode in the second display area and defining a second opening which exposes at least a portion of the second pixel electrode; and a light blocking pattern layer overlapping the first pixel defining layer and the second pixel defining layer in the first light blocking area and the second light blocking area.

18. The display device of claim 17, wherein end portions of each of the first pixel defining layer and the second pixel defining layer in a first direction are aligned with end portions of the light blocking pattern layer.

19. The display device of claim 17, wherein the first display area comprises a first gap in a first direction between an end portion of the first insulating layer and an end portion of the light blocking pattern layer, the second display area comprises a second gap in the first direction between an end portion of the second insulating layer and an end portion of the light blocking pattern layer, the first gap overlaps the first inclined surface of the first insulating layer, and the second gap overlaps the second inclined surface of the second insulating layer.

20. The display device of claim 19, wherein the second gap is smaller than or equal to the first gap.

*    *    *    *    *